US012660510B2

(12) United States Patent
Igarashi et al.

(10) Patent No.: US 12,660,510 B2
(45) Date of Patent: Jun. 16, 2026

(54) MAGNETIC MEMORY DEVICE AND METHOD FOR MANUFACTURING THE SAME

(71) Applicant: Kioxia Corporation, Tokyo (JP)

(72) Inventors: Taichi Igarashi, Seoul (KR); Yuichi Ito, Seoul (KR); Eiji Kitagawa, Seoul (KR); Masayoshi Iwayama, Seoul (KR)

(73) Assignee: Kioxia Corporation, Tokyo (JP)

( * ) Notice: Subject to any disclaimer, the term of this patent is extended or adjusted under 35 U.S.C. 154(b) by 169 days.

(21) Appl. No.: 18/332,759

(22) Filed: Jun. 12, 2023

(65) Prior Publication Data

US 2024/0074327 A1 Feb. 29, 2024

(30) Foreign Application Priority Data

Aug. 23, 2022 (JP) ................................. 2022-132628

(51) Int. Cl.
| | |
|---|---|
| *G11C 11/16* | (2006.01) |
| *H10B 61/00* | (2023.01) |
| *H10N 50/01* | (2023.01) |
| *H10N 50/10* | (2023.01) |
| *H10N 50/80* | (2023.01) |

(52) U.S. Cl.
CPC ........... *H10N 50/80* (2023.02); *G11C 11/161* (2013.01); *H10B 61/00* (2023.02); *H10N 50/01* (2023.02); *H10N 50/10* (2023.02); *G11C 11/1673* (2013.01); *G11C 11/1675* (2013.01); *G11C 11/1697* (2013.01)

(58) Field of Classification Search
CPC .............. G11C 11/161; G11C 11/1673; G11C 11/1675; G11C 11/1697
USPC ......................................................... 365/158
See application file for complete search history.

(56) References Cited

U.S. PATENT DOCUMENTS

| | | | |
|---|---|---|---|
| 2021/0083000 A1 | 3/2021 | Kumura | |
| 2021/0167278 A1 | 6/2021 | Ishitani et al. | |
| 2021/0288243 A1* | 9/2021 | Ochiai | ................... H10N 50/85 |
| 2022/0085103 A1 | 3/2022 | Yoshino et al. | |
| 2022/0085281 A1 | 3/2022 | Kanaya | |
| 2022/0093146 A1* | 3/2022 | Akiyama | ........... H10N 70/8833 |
| 2022/0093847 A1 | 3/2022 | Ochiai et al. | |

(Continued)

FOREIGN PATENT DOCUMENTS

| | | |
|---|---|---|
| JP | 2021048223 A | 3/2021 |
| JP | 2021090041 A | 6/2021 |

(Continued)

*Primary Examiner* — Alfredo Bermudez Lozada
(74) *Attorney, Agent, or Firm* — Holtz, Holtz & Volek PC

(57) ABSTRACT

According to one embodiment, a magnetic memory device includes: a first interconnect; a second interconnect; a first switching element provided on the first interconnect; a second switching element provided on the second interconnect; a first insulating layer provided surrounding the first switching element; a second insulating layer surrounding the second switching element and not being in contact with the first insulating layer; a first conductor provided on the first switching element and the first insulating layer; a second conductor provided on the second switching element and the second insulating layer; a first magnetoresistive effect element provided on the first conductor; and a second magnetoresistive effect element provided on the second conductor.

18 Claims, 22 Drawing Sheets

(56)                    References Cited

U.S. PATENT DOCUMENTS

2022/0223650  A1*    7/2022   Katine  .................... H10N 50/80
2023/0071013  A1     3/2023   Sawada et al.

FOREIGN PATENT DOCUMENTS

JP          2022049880  A     3/2022
JP          2022049883  A     3/2022
TW           202213344  A     4/2022
TW           202215641  A     4/2022

* cited by examiner

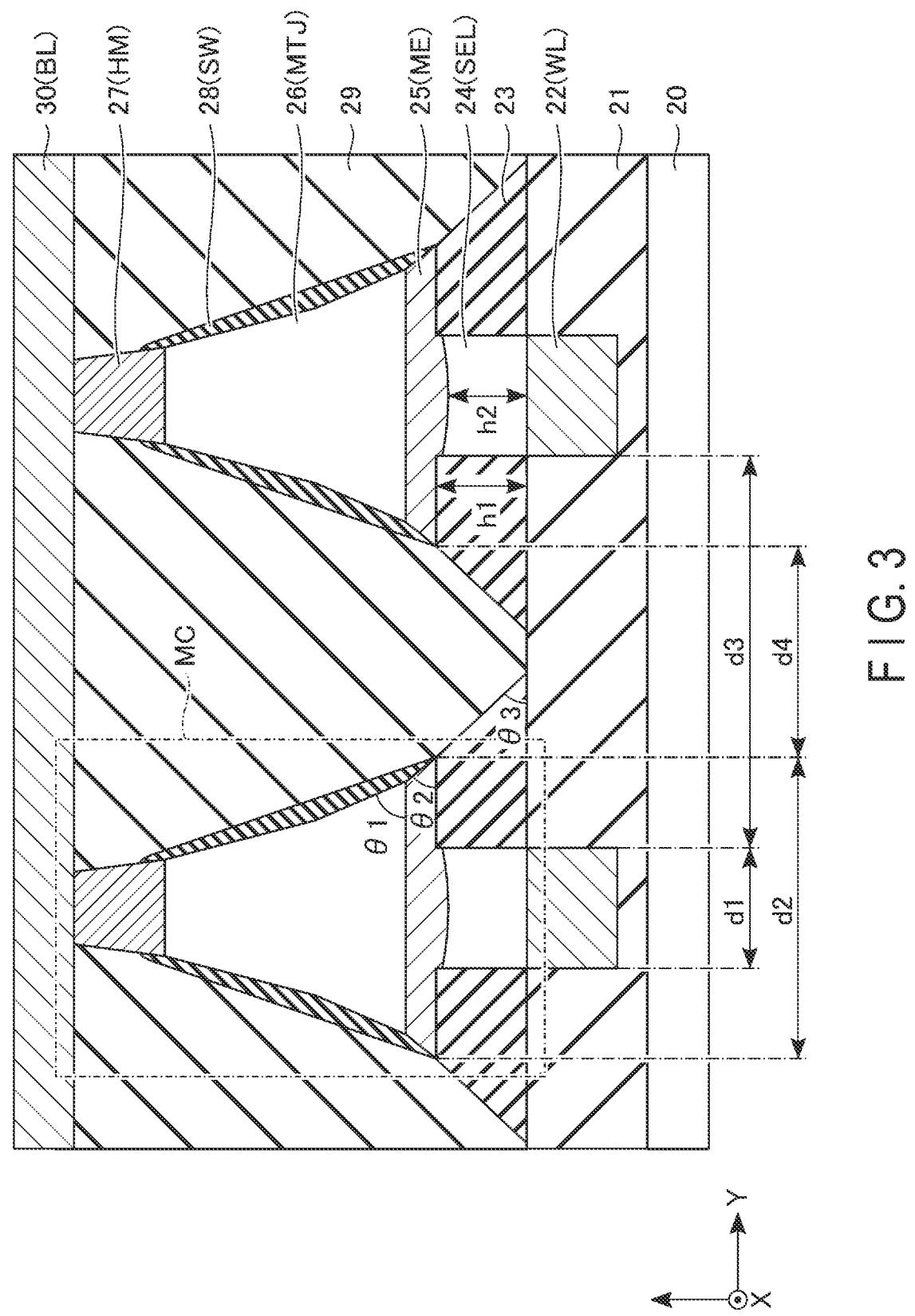
F I G. 3

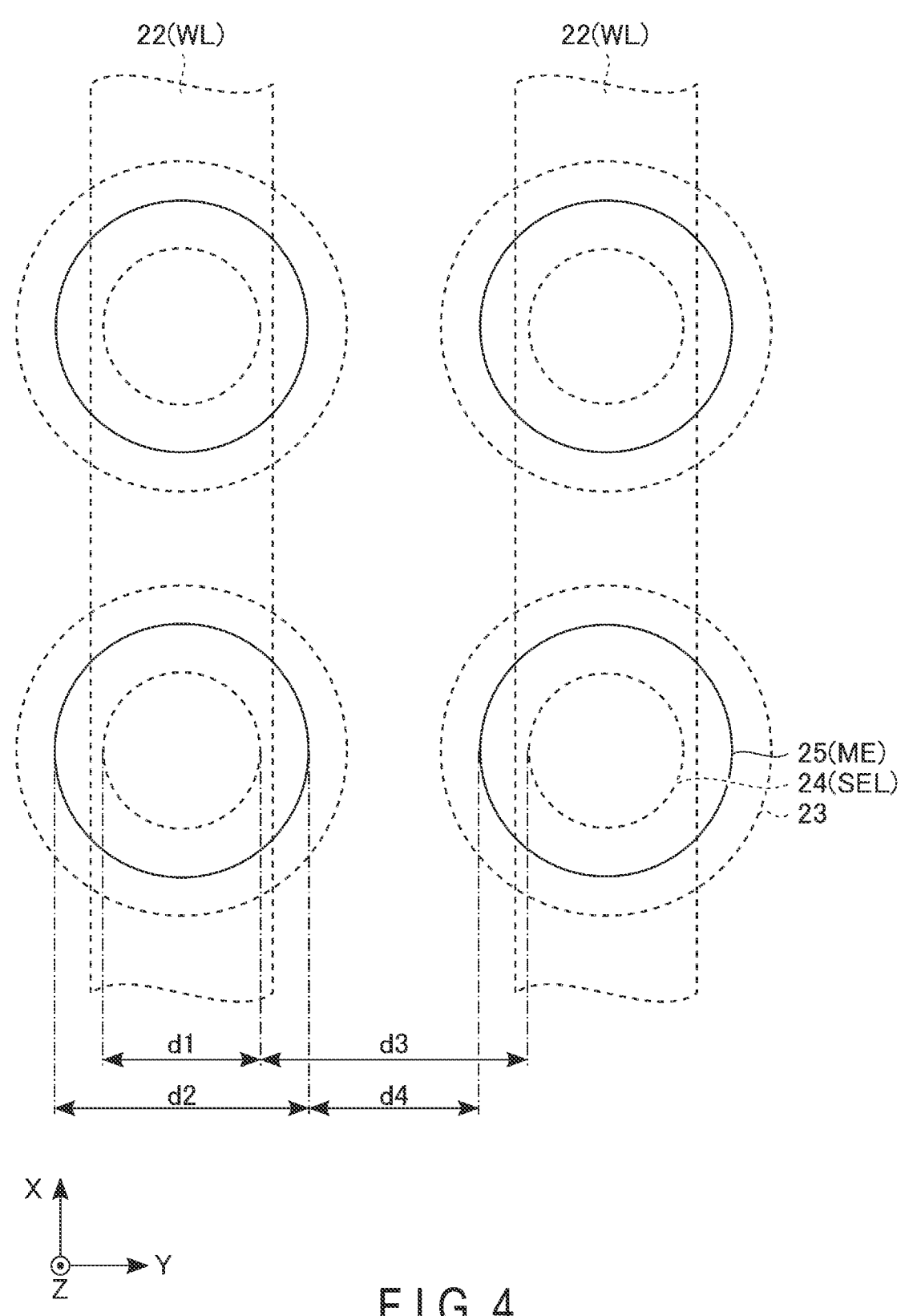
22(WL)    22(WL)
25(ME)
24(SEL)
23
d1    d3
d2    d4
X
Z    Y
F I G. 4

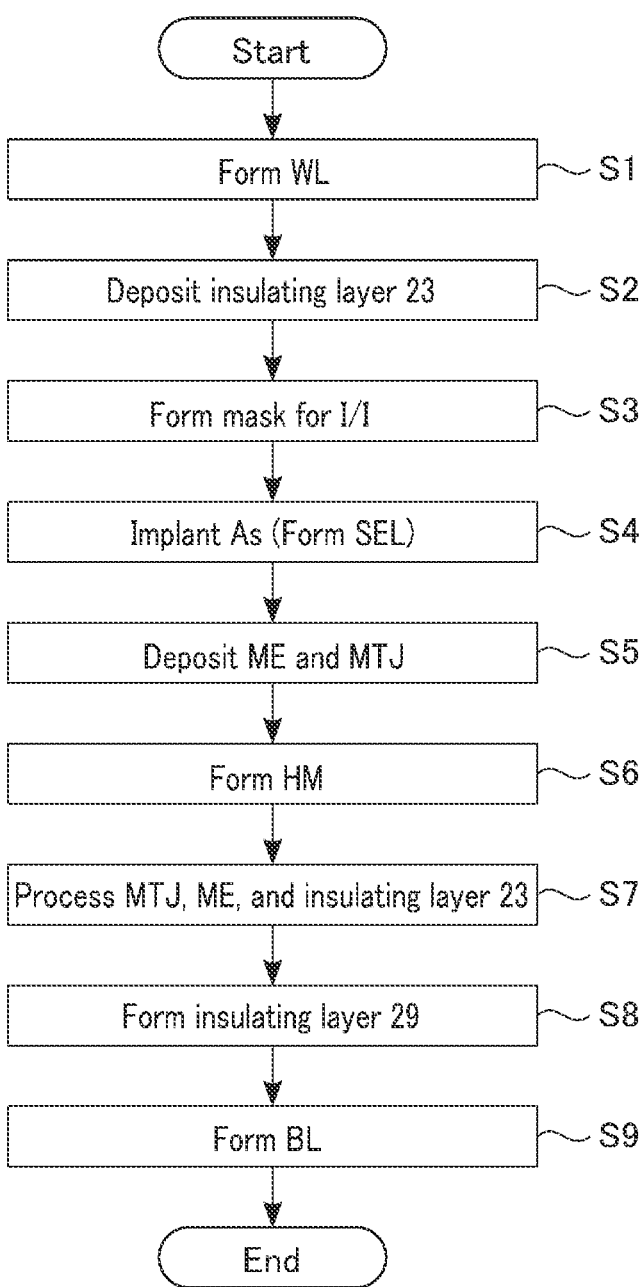
F I G. 6

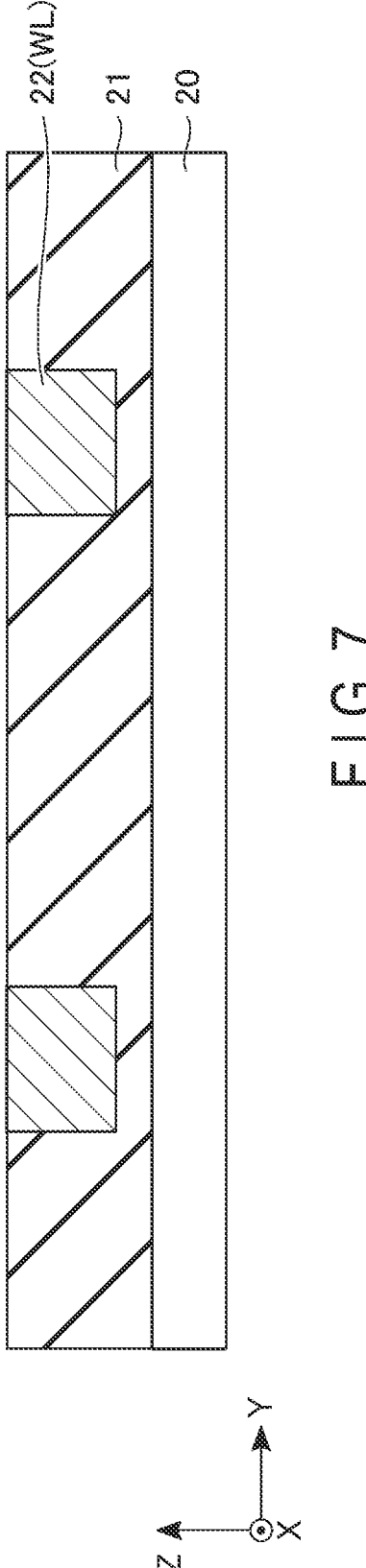
F I G. 7

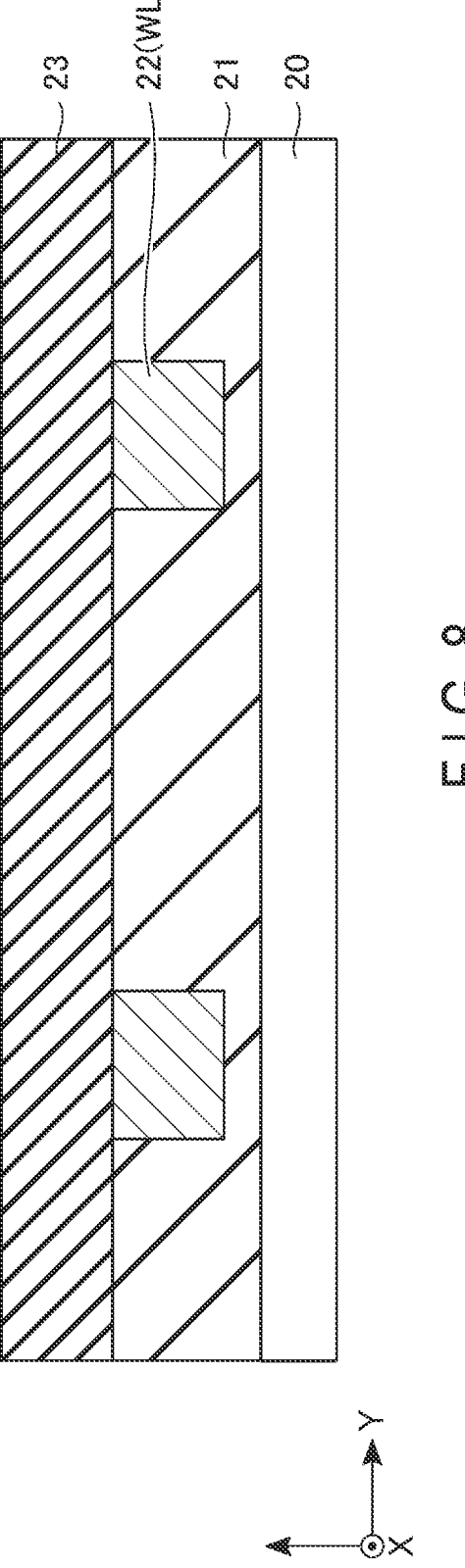
F I G. 8

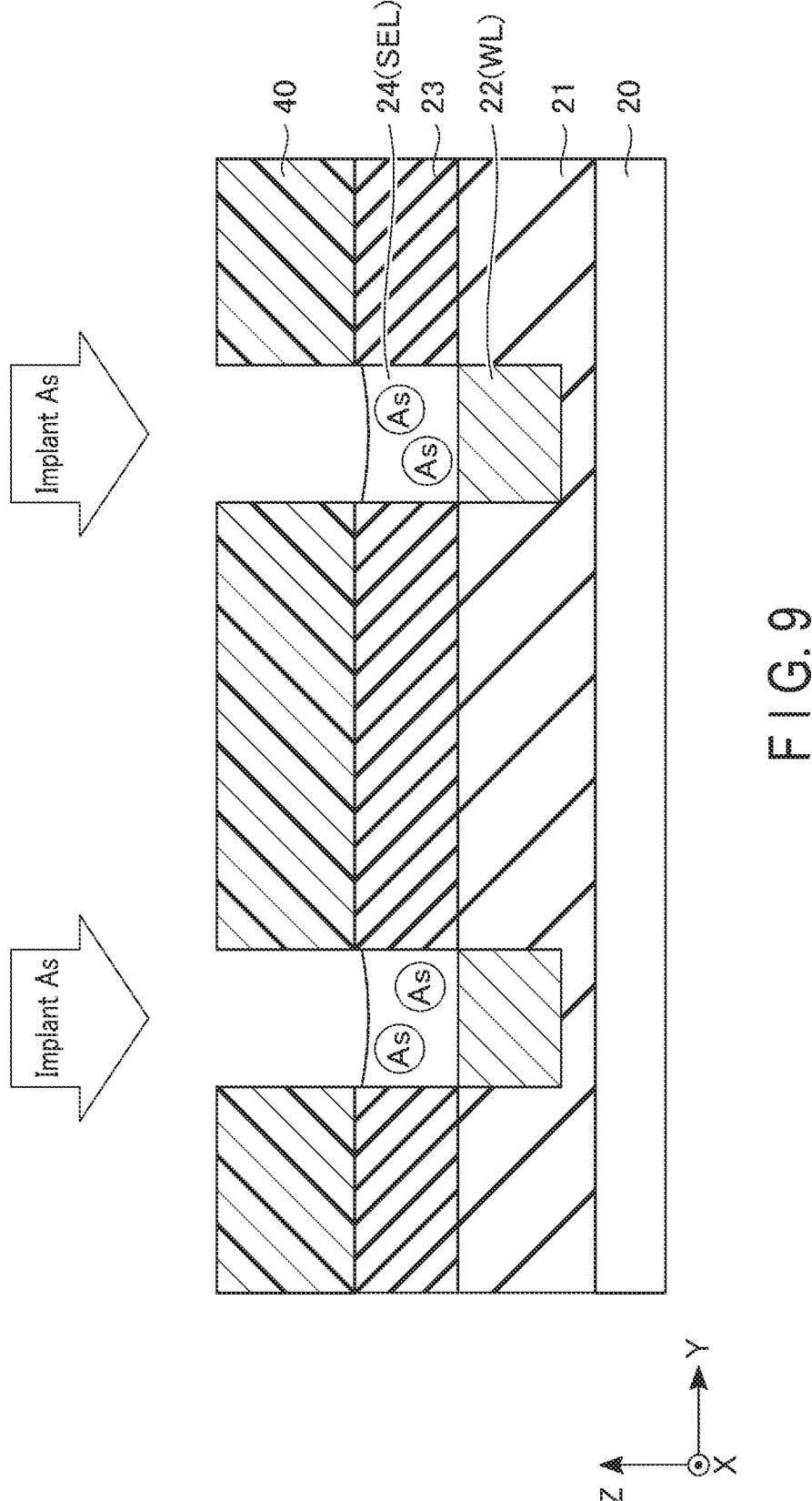
F I G. 9

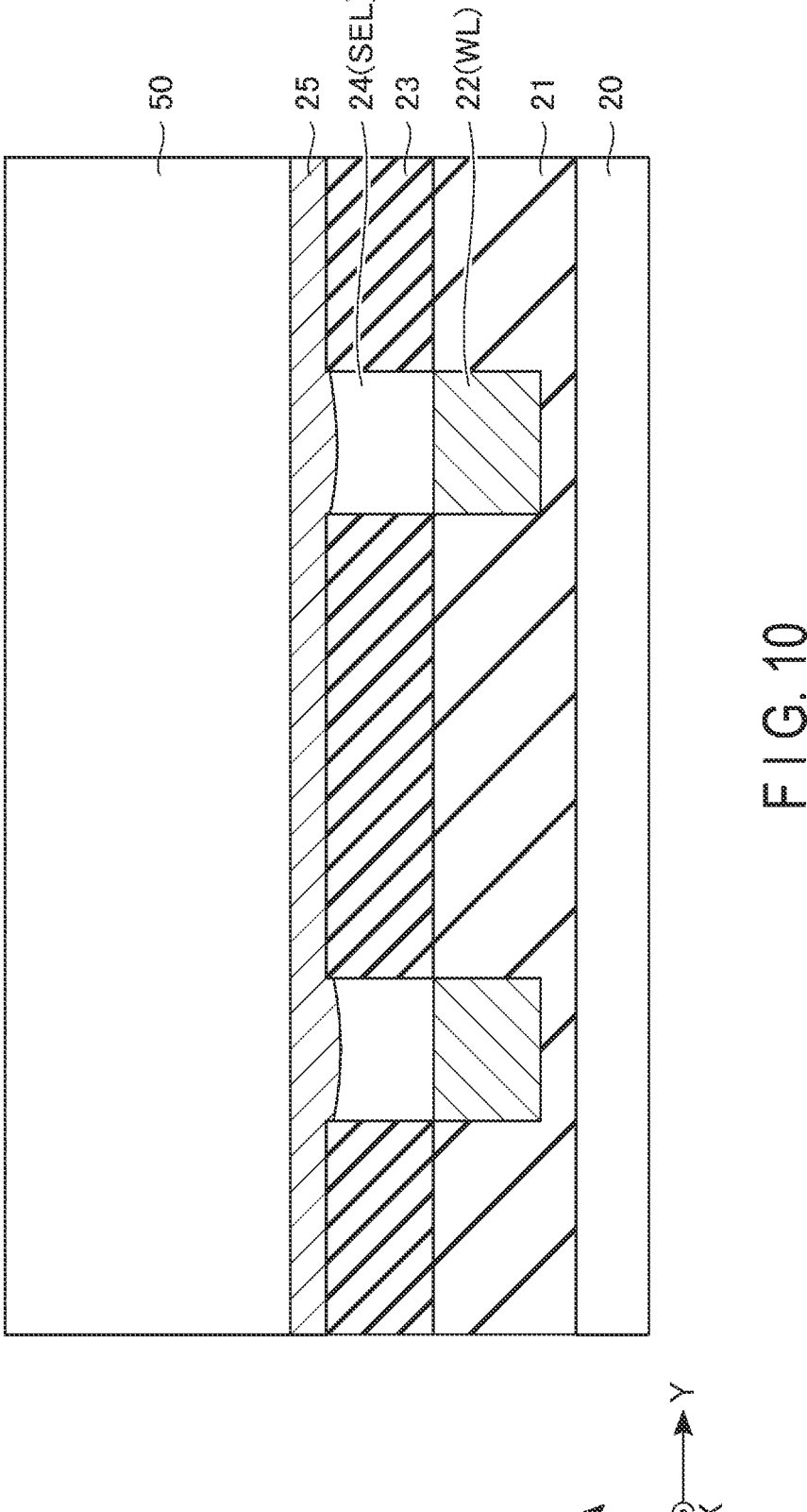
F I G. 10

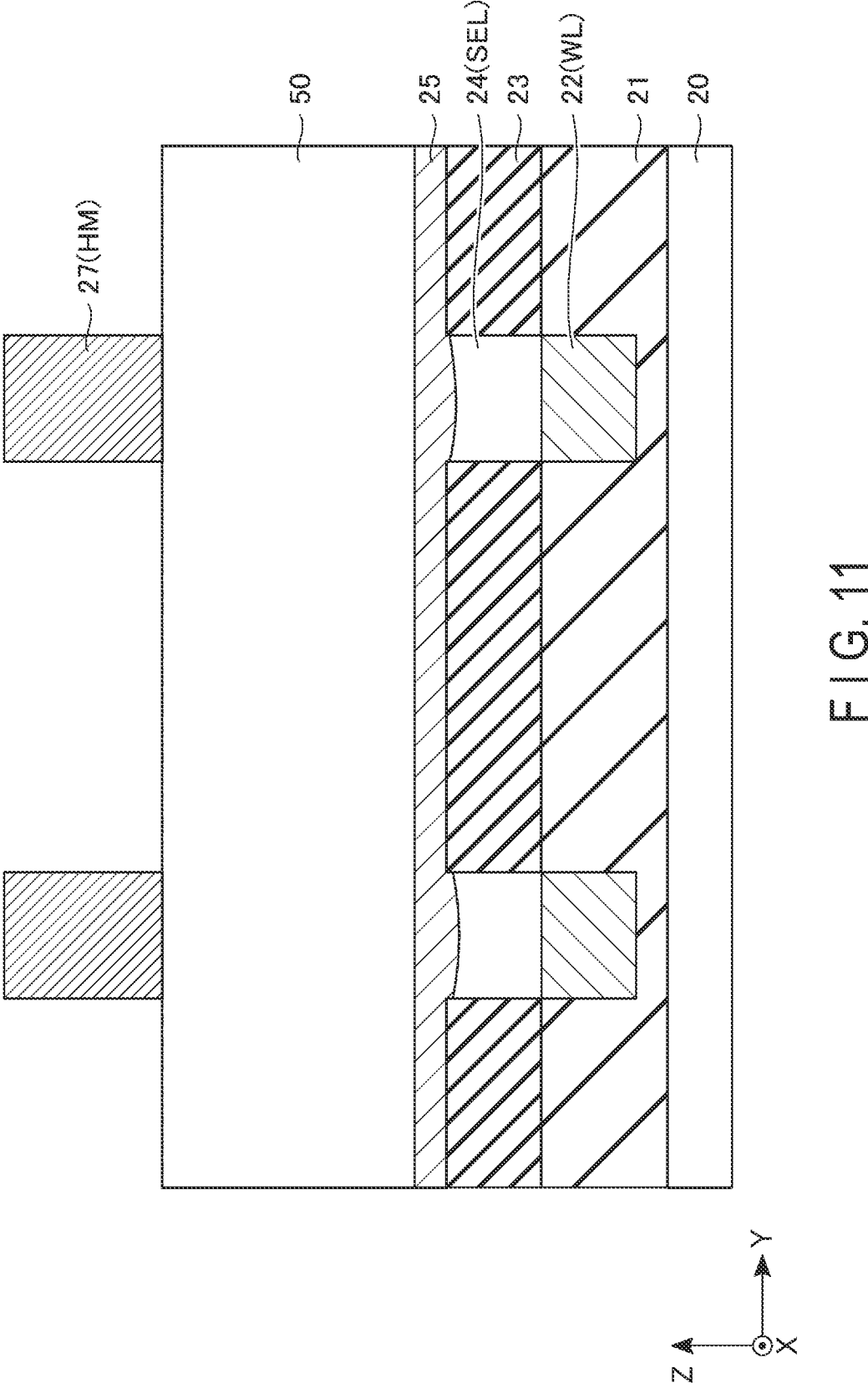
F I G. 11

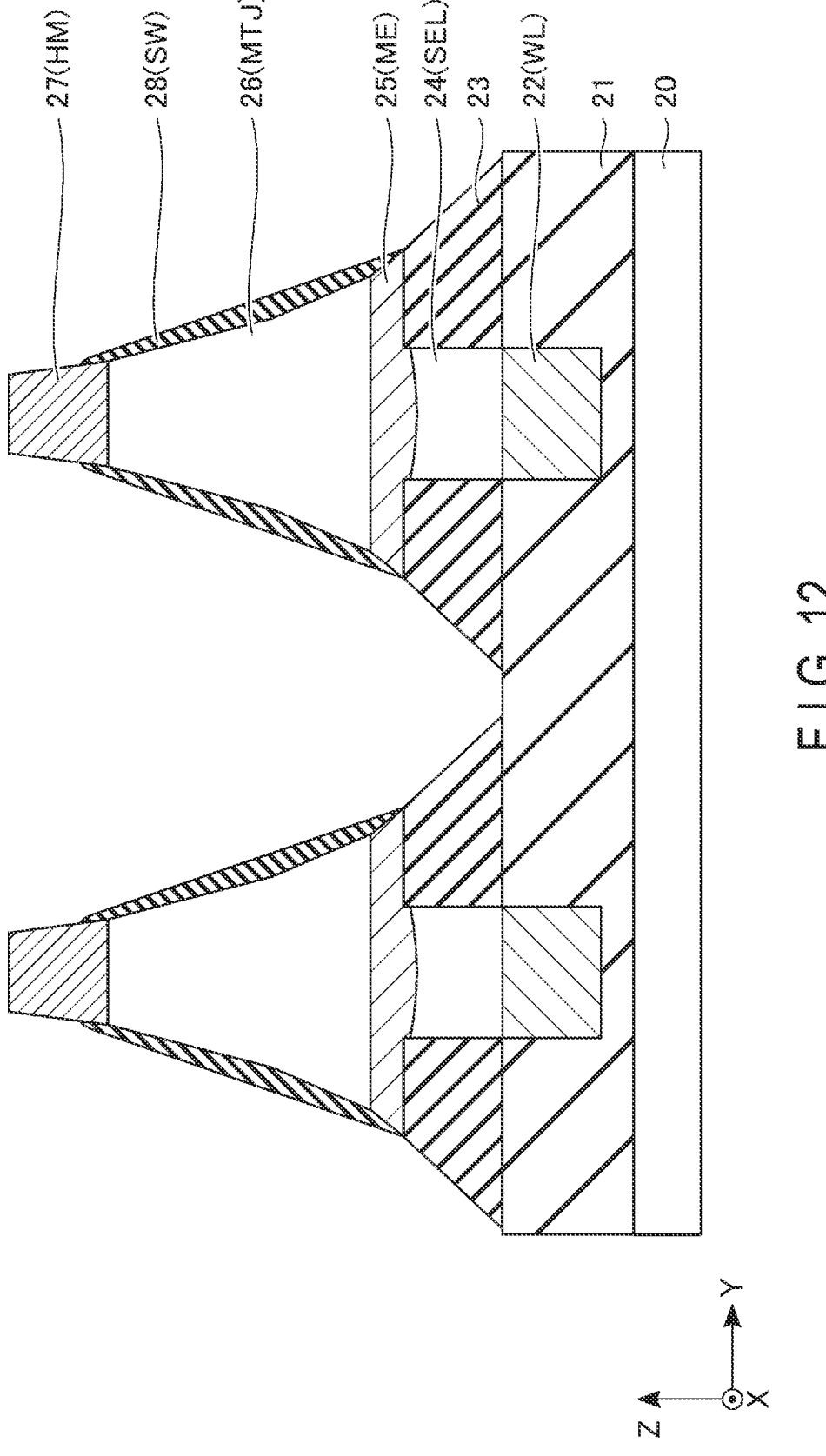
F I G. 12

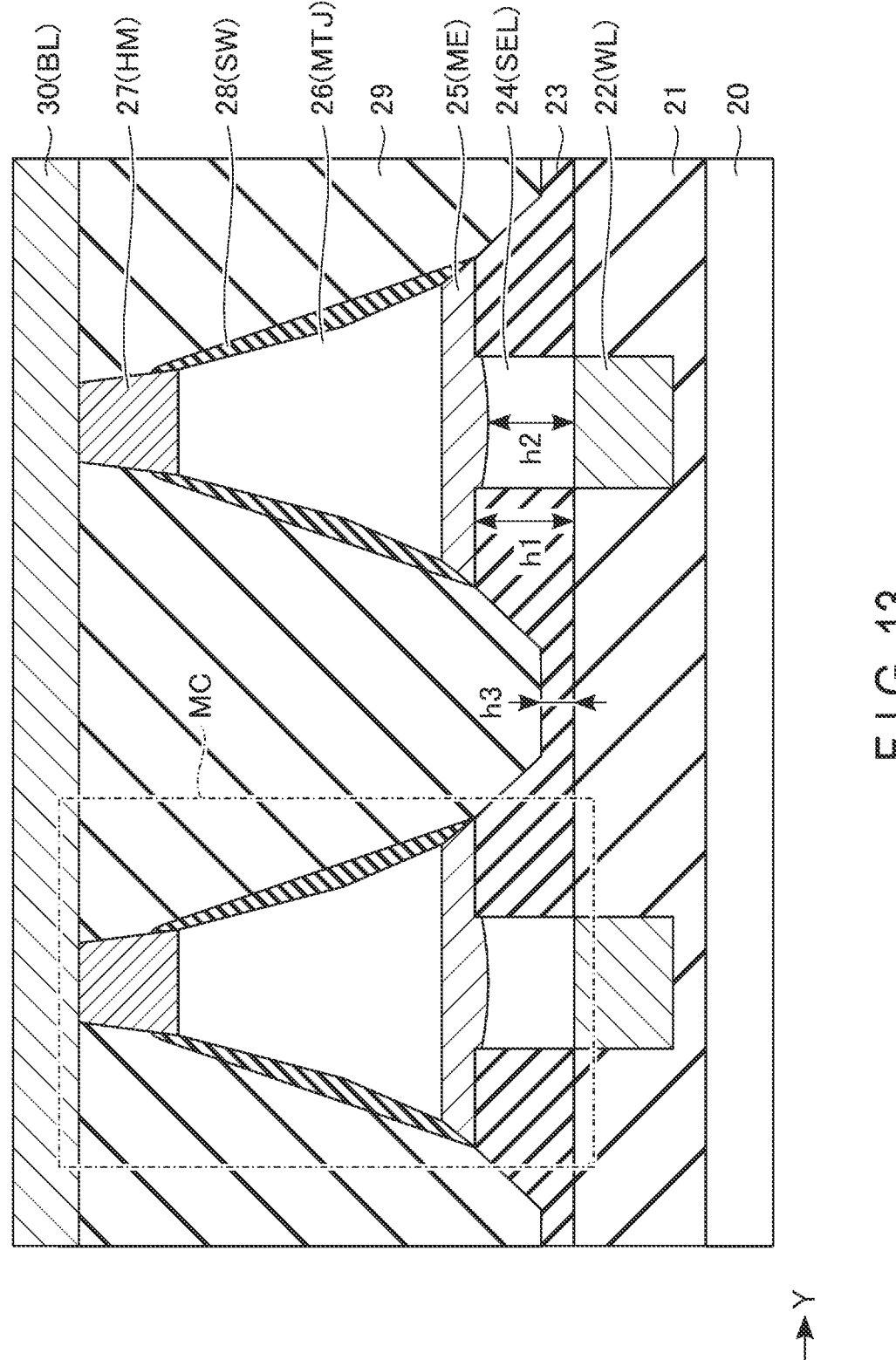
F I G. 13

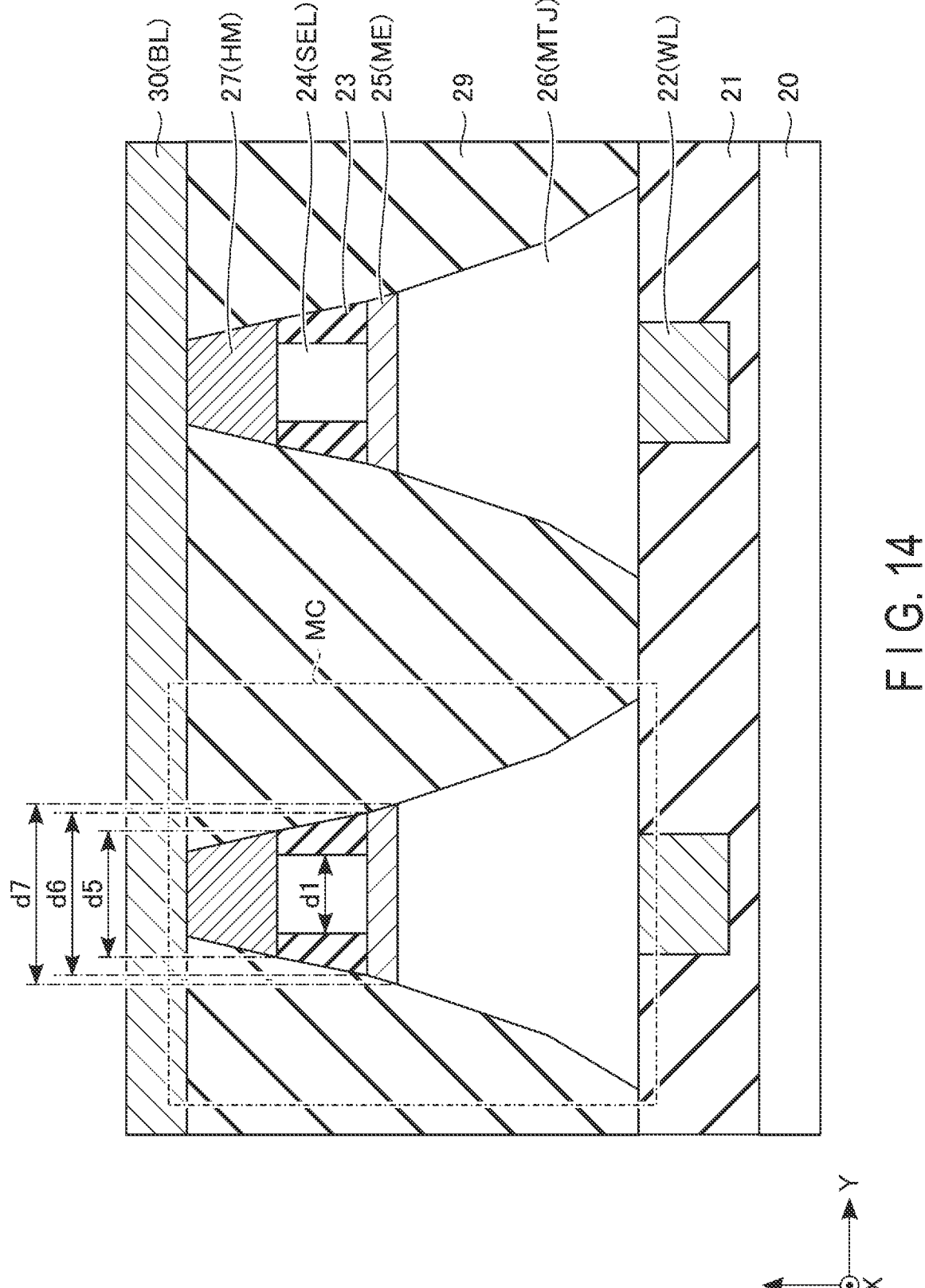
F I G. 14

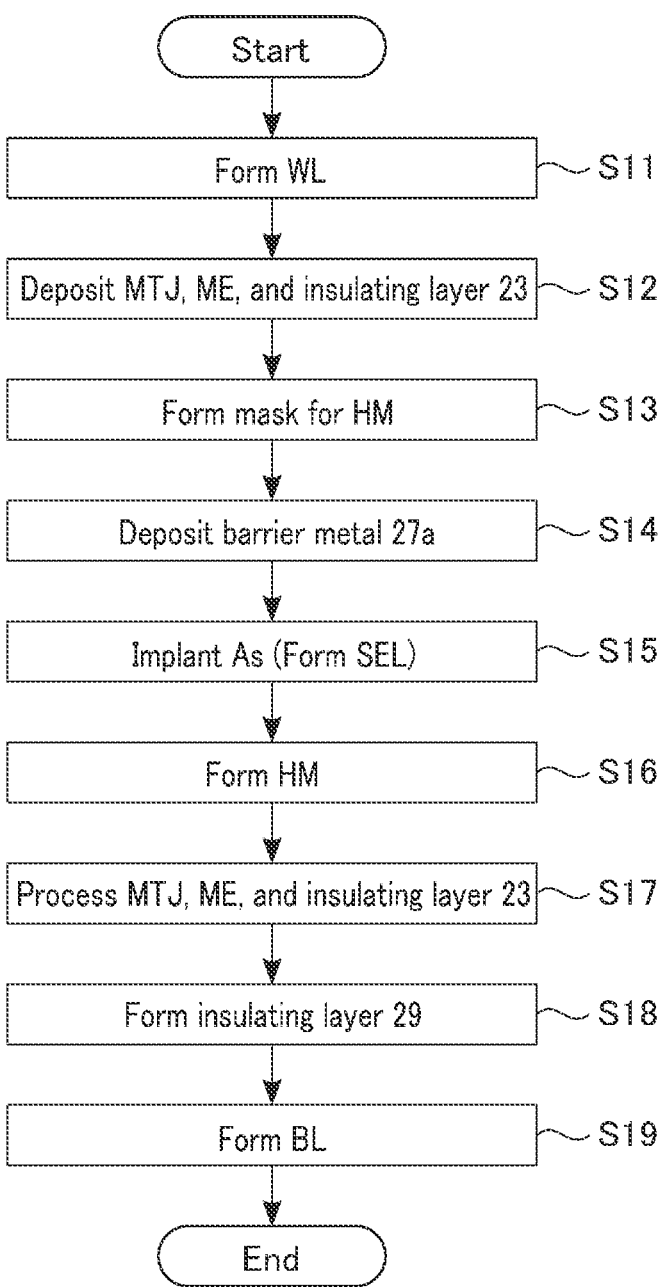
F I G. 15

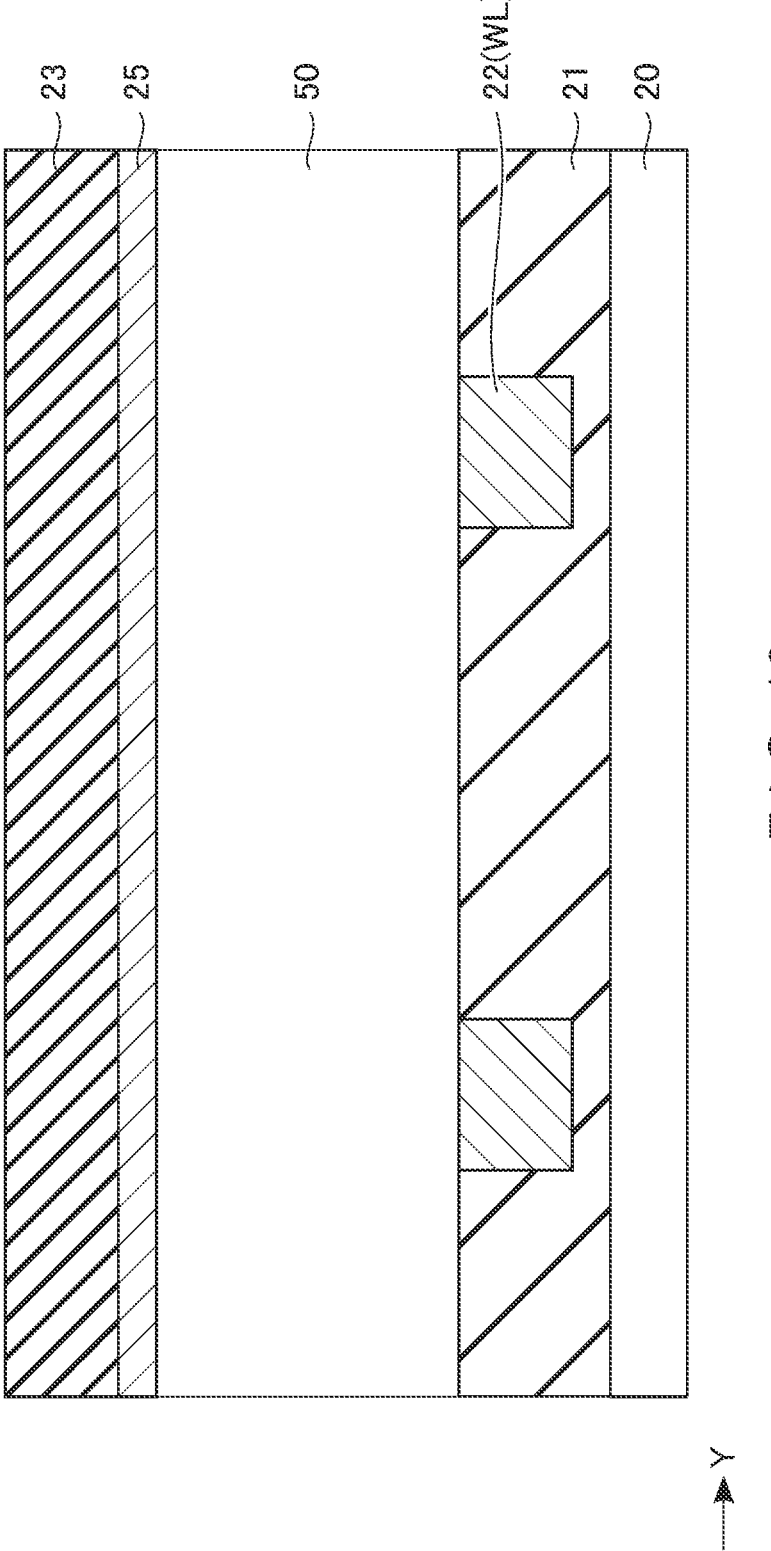
F I G. 16

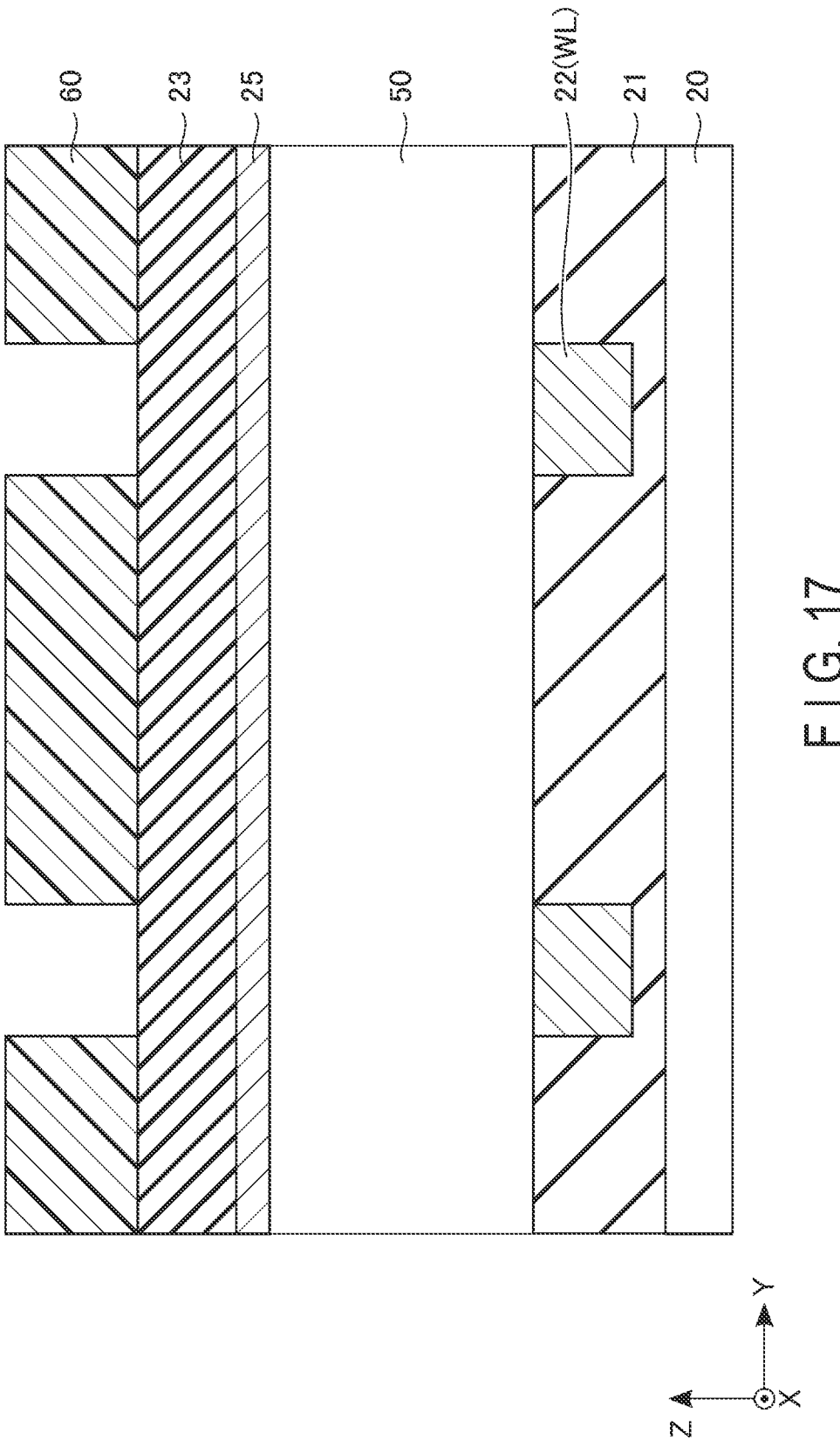
F I G. 17

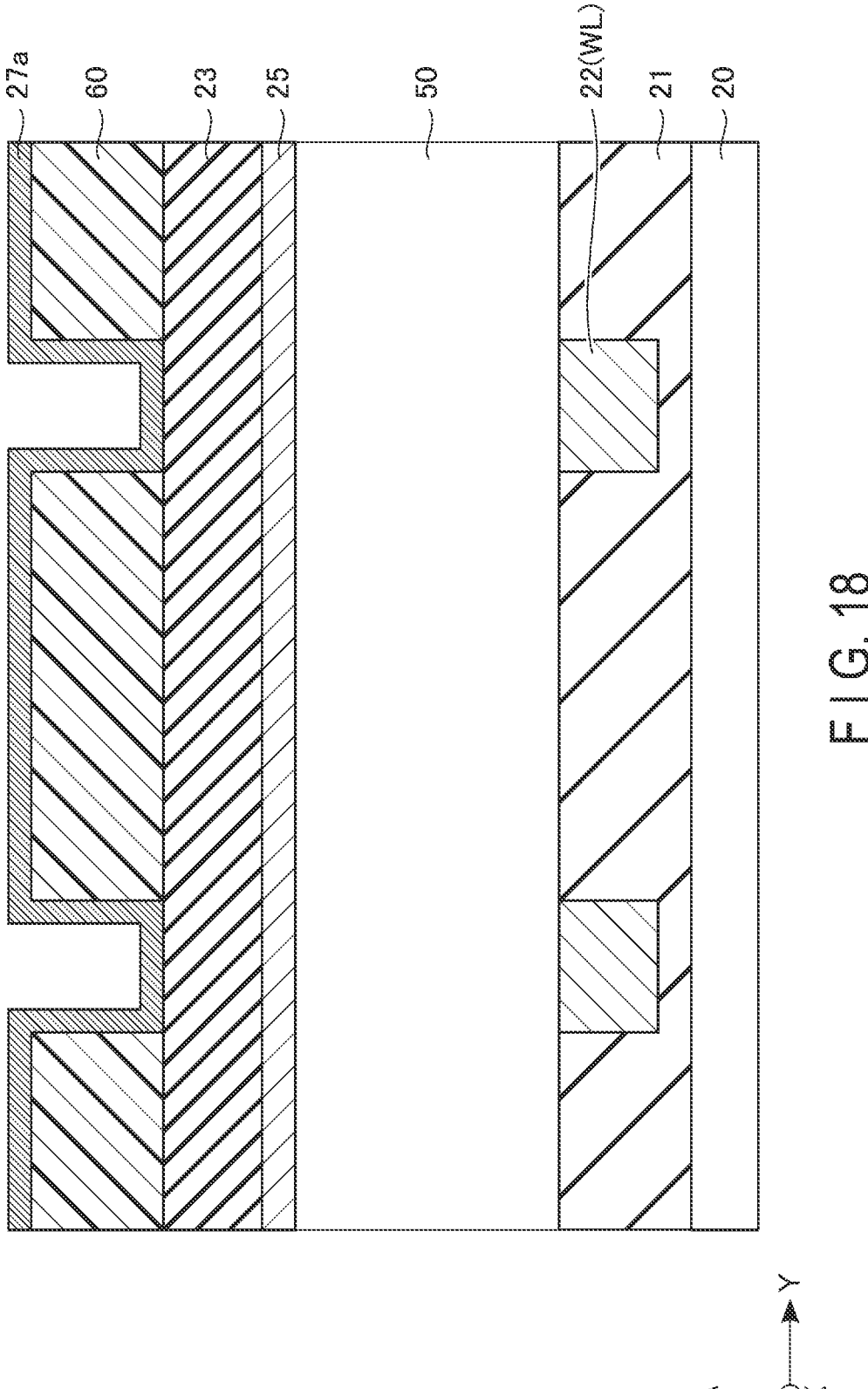
F I G. 18

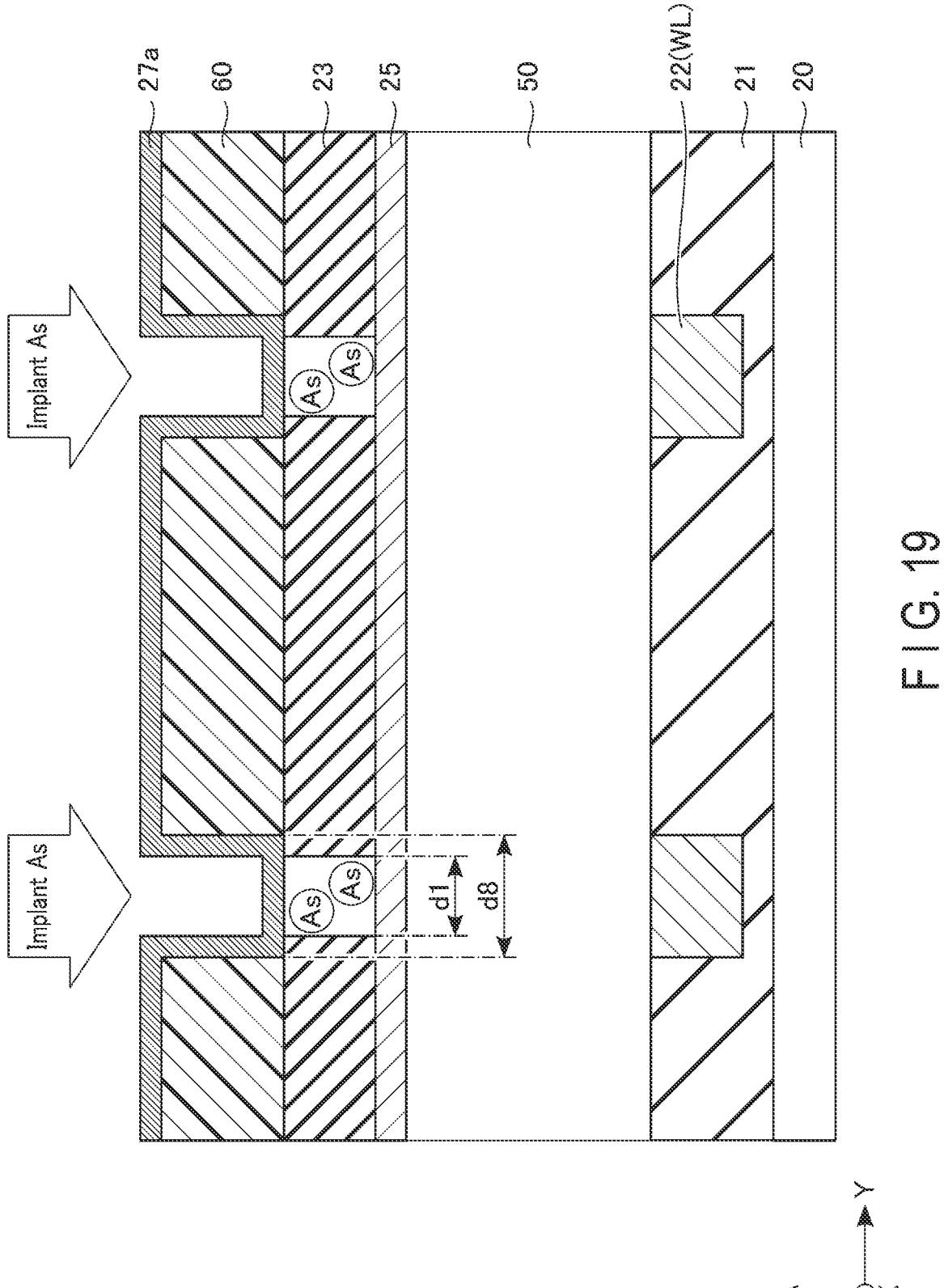
F I G. 19

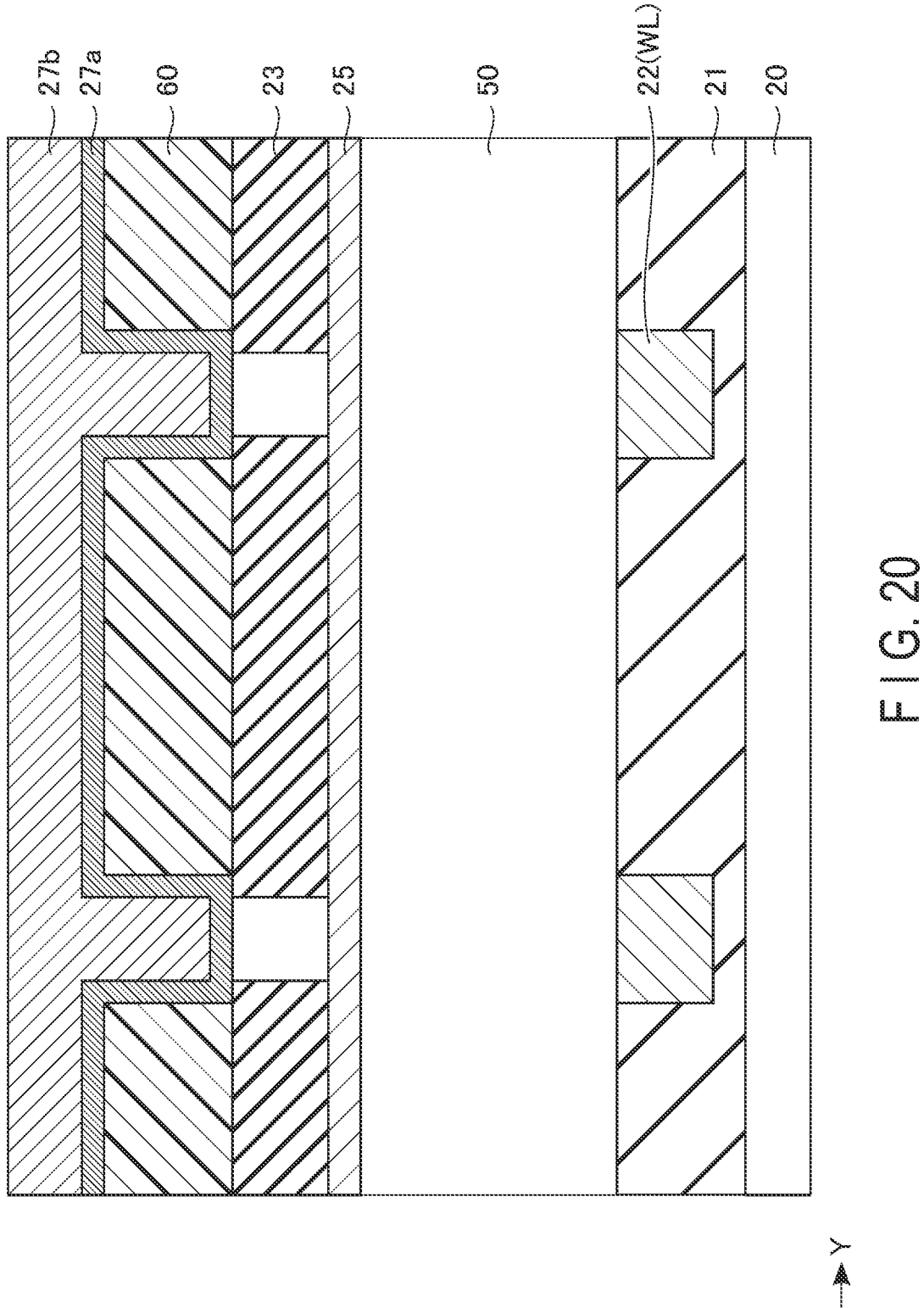
F I G. 20

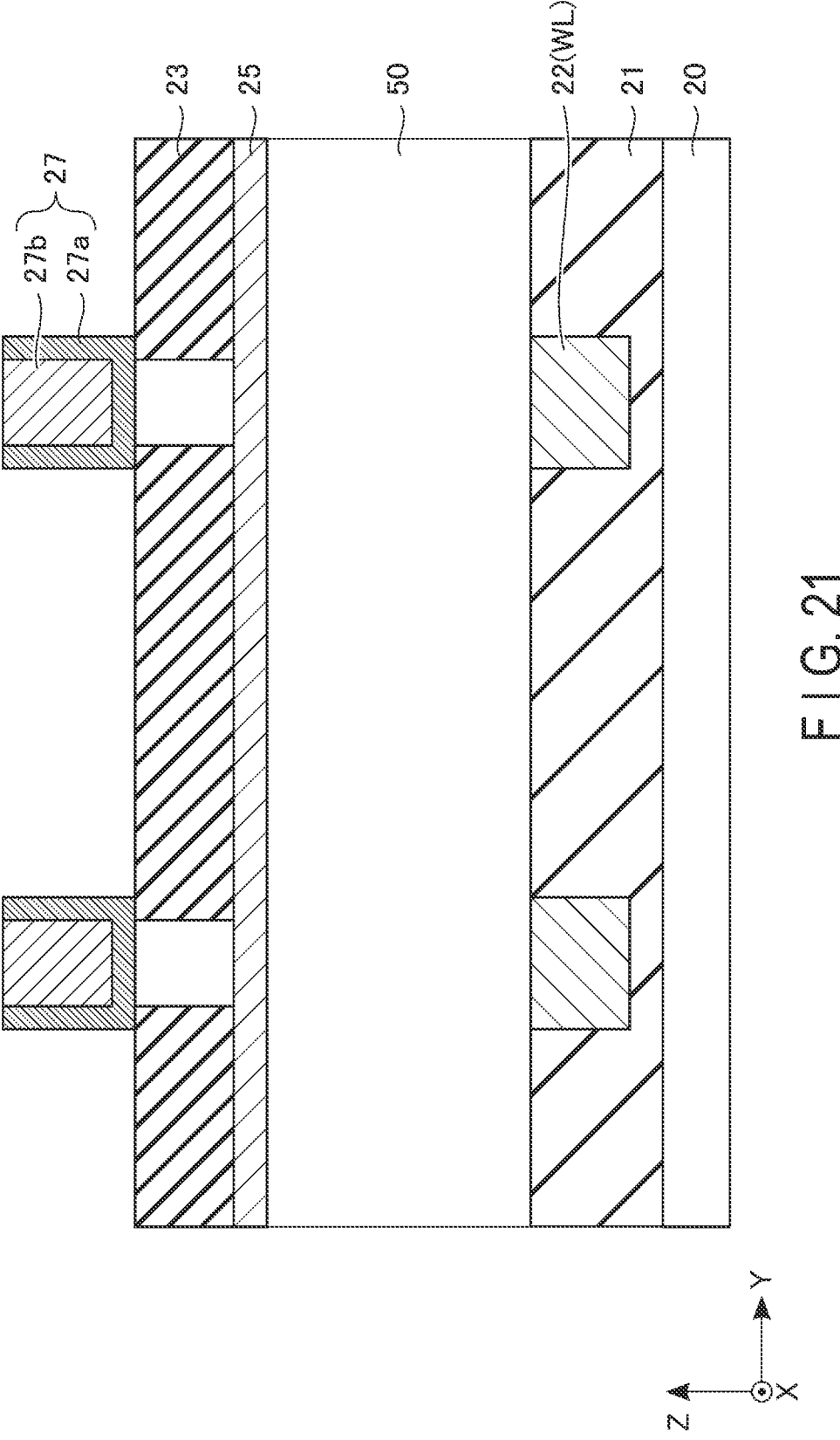
F I G. 21

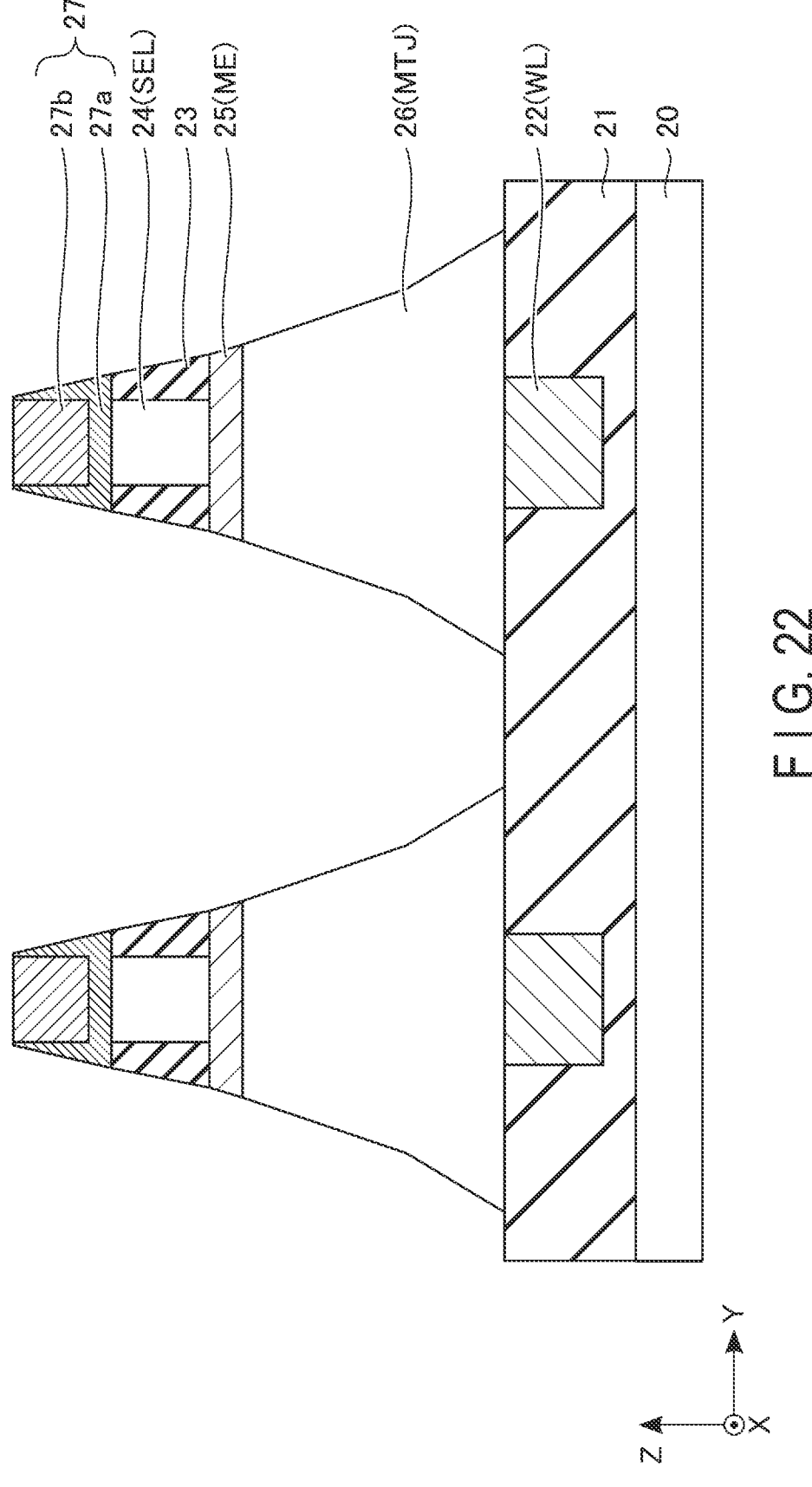
F I G. 22

MAGNETIC MEMORY DEVICE AND METHOD FOR MANUFACTURING THE SAME

CROSS-REFERENCE TO RELATED APPLICATION(S)

This application is based upon and claims the benefit of priority from Japanese Patent Application No. 2022-132628, filed Aug. 23, 2022, the entire contents of which are incorporated herein by reference.

FIELD

Embodiments described herein relate generally to a magnetic memory device and a method for manufacturing the same.

BACKGROUND

A magnetic memory device using a magnetoresistive effect element as a memory element (magnetoresistive random access memory: MRAM) is known.

BRIEF DESCRIPTION OF THE DRAWING(S)

FIG. 3 is a cross-sectional view of the memory cell array included in the magnetic memory device according to the first embodiment.

FIG. 4 is a plan view of middle electrodes in the memory cell array included in the magnetic memory device according to the first embodiment.

FIG. 6 is a flowchart showing a process of manufacturing the memory cell array included in the magnetic memory device according to the first embodiment.

FIG. 7 is a cross-sectional view showing a process of manufacturing the memory cell array included in the magnetic memory device according to the first embodiment.

FIG. 8 is a cross-sectional view showing a process of manufacturing the memory cell array included in the magnetic memory device according to the first embodiment.

FIG. 9 is a cross-sectional view showing a process of manufacturing the memory cell array included in the magnetic memory device according to the first embodiment.

FIG. 10 is a cross-sectional view showing a process of manufacturing the memory cell array included in the magnetic memory device according to the first embodiment.

FIG. 11 is a cross-sectional view showing a process of manufacturing the memory cell array included in the magnetic memory device according to the first embodiment.

FIG. 12 is a cross-sectional view showing a process of manufacturing the memory cell array included in the magnetic memory device according to the first embodiment.

FIG. 13 is a cross-sectional view of a memory cell array included in a magnetic memory device according to a second embodiment.

FIG. 14 is a cross-sectional view of a memory cell array included in a magnetic memory device according to a third embodiment.

FIG. 15 is a flowchart showing a process of manufacturing the memory cell array included in the magnetic memory device according to the third embodiment.

FIG. 16 is a cross-sectional view showing a process of manufacturing the memory cell array included in the magnetic memory device according to the third embodiment.

FIG. 17 is a cross-sectional view showing a process of manufacturing the memory cell array included in the magnetic memory device according to the third embodiment.

FIG. 18 is a cross-sectional view showing a process of manufacturing the memory cell array included in the magnetic memory device according to the third embodiment.

FIG. 19 is a cross-sectional view showing a process of manufacturing the memory cell array included in the magnetic memory device according to the third embodiment.

FIG. 20 is a cross-sectional view showing a process of manufacturing the memory cell array included in the magnetic memory device according to the third embodiment.

FIG. 21 is a cross-sectional view showing a process of manufacturing the memory cell array included in the magnetic memory device according to the third embodiment.

FIG. 22 is a cross-sectional view showing a process of manufacturing the memory cell array included in the magnetic memory device according to the third embodiment.

DETAILED DESCRIPTION

In general, according to one embodiment, a magnetic memory device includes: a first interconnect extending in a first direction; a second interconnect extending in the first direction and arranged beside the first interconnect in a second direction intersecting the first direction; a first switching element provided on the first interconnect; a second switching element provided on the second interconnect; a first insulating layer provided in an identical layer to the first switching element and surrounding the first switching element; a second insulating layer provided in an identical layer to the second switching element, surrounding the second switching element, and not being in contact with the first insulating layer; a first conductor provided on the first switching element and the first insulating layer; a second conductor provided on the second switching element and the second insulating layer; a first magnetoresistive effect element provided on the first conductor; and a second magnetoresistive effect element provided on the second conductor.

Hereinafter, embodiments will be described with reference to the drawings. In the description below, structural elements having the same functions and configurations will be denoted by a common reference symbol. To distinguish a plurality of structural elements having a common reference symbol from each other, an appended symbol is added after the common reference symbol. If it is unnecessary to distinguish the structural elements, only a common reference symbol is assigned to the structural elements, and no appended symbol is added. Herein, appended symbols are not limited to subscripts or superscripts and they may be lower-case alphabetical letters added to references symbols, indices that indicate an array, etc.

1. First Embodiment

A magnetic memory device according to the first embodiment will be described. Examples of the magnetic memory device according to the first embodiment include a magnetic memory device of a perpendicular magnetic recording type which uses, as a resistance change element, an element that exhibits a magnetoresistive effect through a magnetic tunnel junction (MTJ) (such an element may be called an MTJ element).

In the following explanation, a case is explained in which an MTJ element is used as a resistance change element and referred to as a magnetoresistive effect element MTJ.

1.1 Configuration

1.1.1 Configuration of Magnetic Memory Device

Figure 1:
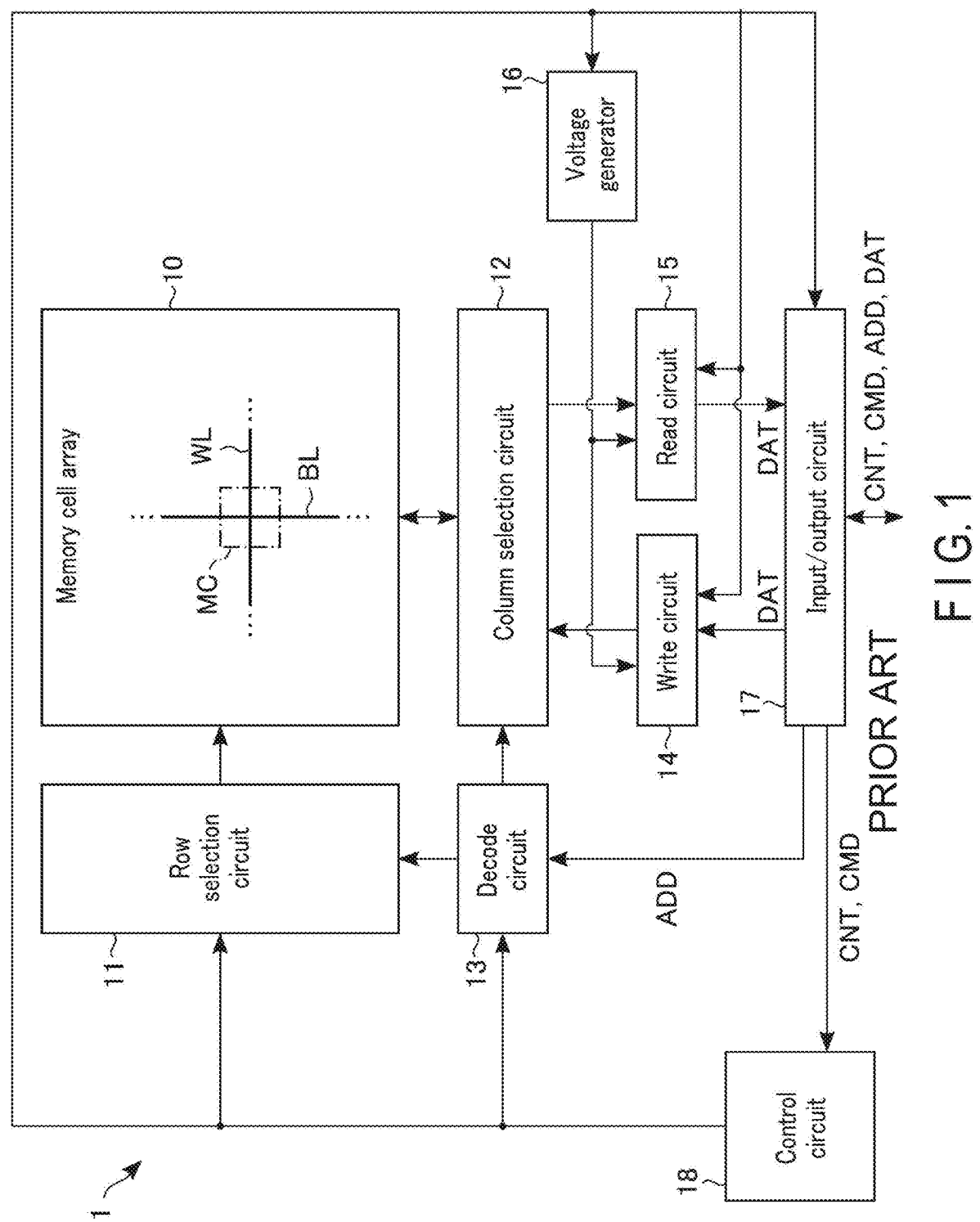
FIG. 1 is a block diagram of a magnetic memory device according to a first embodiment.

First, an example of an overall configuration of a magnetic memory device 1 will be described with reference to FIG. 1. FIG. 1 is a block diagram showing the example of the overall configuration of the magnetic memory device 1 according to the first embodiment. In FIG. 1, some of the couplings between the structural elements are indicated by arrows; however, the couplings between the structural elements are not limited thereto.

As illustrated in FIG. 1, the magnetic memory device 1 includes a memory cell array 10, a row selection circuit 11, a column selection circuit 12, a decode circuit 13, a write circuit 14, a read circuit 15, a voltage generator 16, an input/output circuit 17, and a control circuit 18.

The memory cell array 10 includes a plurality of memory cells MC. Each of the memory cells MC is associated with a pair of a row and a column. Specifically, memory cells MC arranged in the same row are coupled to the same word line WL. Memory cells MC arranged in the same column are coupled to the same bit line BL.

The row selection circuit 11 is coupled to the memory cell array 10 via word lines WL. The row selection circuit 11 receives decoding results (row address) of an address ADD from the decode circuit 13. The row selection circuit 11 sets a word line WL corresponding to the row address to a selected state.

The column selection circuit 12 is coupled to the memory cell array 10 via bit lines BL. The column selection circuit 12 receives decoding results (column address) of the address ADD from the decode circuit 13. The column selection circuit 12 sets a bit line BL corresponding to the column address to a selected state.

The decode circuit 13 decodes the address ADD received from the input/output circuit 17. The address ADD includes a column address and a row address. The decode circuit 13 supplies the decoding result of the address ADD to the row selection circuit 11 and the column selection circuit 12.

The write circuit 14 writes data to the memory cells MC. The write circuit 14 includes, for example, a write driver (not shown).

The read circuit 15 reads data from the memory cells MC. The read circuit 15 includes, for example, a sense amplifier (not shown).

The voltage generator 16 generates voltages for various types operations of the memory cell array 10, using a power supply voltage provided from an outside (not illustrated) of the magnetic memory device 1. The voltage generator 16 generates, for example, a voltage necessary for a write operation, and outputs the generated voltage to the write circuit 14. Also, the voltage generator 16 generates, for example, a voltage necessary for a read operation, and outputs the generated voltage to the read circuit 15.

The input/output circuit 17 transfers an address ADD received from the outside of the magnetic memory device 1 to the decode circuit 13. The input/output circuit 17 transfers a command CMD received from the outside of the magnetic memory device 1 to the control circuit 18. The input/output circuit 17 transmits and receives various control signals CNT between the outside of the magnetic memory device 1 and the control circuit 18. The input/output circuit 17 transfers to the write circuit 14 the data DAT received from the outside of the magnetic memory device 1, and outputs to the outside of the magnetic memory device 1 the data DAT transferred from the read circuit 15.

The control circuit 18 controls the operations of the row selection circuit 11, the column selection circuit 12, the decode circuit 13, the write circuit 14, the read circuit 15, the voltage generator 16, and the input/output circuit 17 in the magnetic memory device 1 in accordance with control signals CNT and commands CMD.

1.1.2 Circuit Configuration of Memory Cell Array

Figure 2:
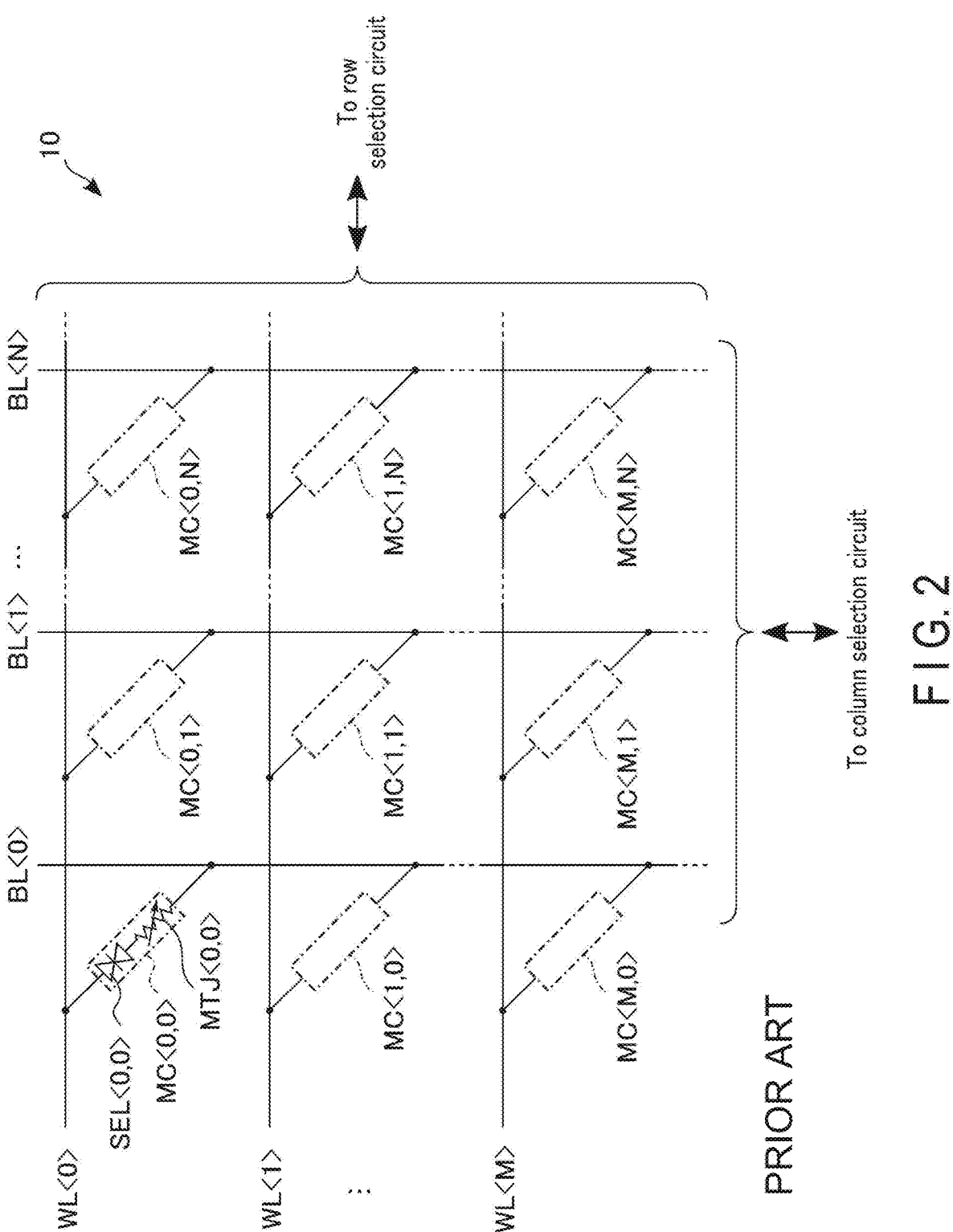
FIG. 2 is a circuit diagram of a memory cell array included in the magnetic memory device according to the first embodiment.

Next, an example of a configuration of the memory cell array 10 will be described with reference to FIG. 2. FIG. 2 is a circuit diagram showing the configuration of the memory cell array 10. In FIG. 2, the memory cells MC, the word lines WL, and the bit lines BL are distinguished by appended symbols including an index ("< >").

As illustrated in FIG. 2, the memory cells MC are arranged in a matrix pattern in the memory cell array 10. Each memory cell is associated with a pair of one of the bit lines BL (BL<0>, BL<1>, . . . , BL<N>) and one of the word lines WL (WL<0>, WL<1>, . . . , WL<M>) (where M and N are integers). In other words, a memory cell MC<i,j> ($0 \leq i \leq M$, $0 \leq j \leq N$) is coupled between a word line WL<i> and a bit line BL<j>.

The memory cell MC<i,j> includes a selector SEL<i,j> and a magnetoresistive effect element MTJ<i,j>. The selector SEL<i,j> and the magnetoresistive effect element MTJ<i,j> are coupled in series. For example, one end of the selector SEL<ij> is coupled to one word line WL<i> and the other end thereof is coupled to one end of the magnetoresistive effect element MTJ<i,j>. The other end of the magnetoresistive effect element MTJ<i,j> is coupled to one bit line BL.

The selector SEL (hereinafter also referred to as "the switching element") has a function as a switch that controls a supply of a current to a corresponding magnetoresistive effect element MTJ in a read operation and a write operation with respect to the magnetoresistive effect element MTJ. More specifically, the selector SEL in a memory cell MC, for example, serves as an insulator having a large resistance value and cuts off a current (turns to an off state), if a voltage applied to the memory cell MC is below a preset threshold voltage. On the other hand, if a voltage applied to the memory cell MC is equal to or higher than the threshold voltage, the selector SEL serves as a conductor having a small resistance value and passes a current (turns to an on state). In other words, the switching element SEL has a function of switching between allowance and interruption of a current flow according to the magnitude of the voltage applied to the memory cell MC, regardless of the direction of the current flow.

The selector SEL may be, for example, a two-terminal type switching element. If the voltage applied between the two terminals is lower than the threshold voltage, the selector SEL is in a high resistance state in which a current hardly flows, or in a non-conductive state. If the voltage applied between the two terminals is equal to or higher than the threshold voltage, the selector SEL is in a low resistance state, namely, in an electrically conductive state. The switching element may have this function regardless of the polarity of the voltage.

The magnetoresistive effect element MTJ functions as a storage element for nonvolatilely storing data. With a current supply controlled by the selector SEL, the magnetoresistive effect element MTJ can be switched to the low resistance state or the high resistance state. Data can be written in the magnetoresistive effect element MTJ according to the change in the resistance state.

1.1.3 Configuration of Memory Cell Array

Next, an example of the configuration of the memory cell array 10 will be described with reference to FIG. 3 and FIG. 4. In the following description, a plane parallel to the surface of a semiconductor substrate 20 is defined as an XY plane, and a direction perpendicular to the XY plane is defined as a Z direction. On the XY plane, the direction along the word lines WL is defined as an X direction, and the direction along the bit lines BL is defined as a Y direction. In each structural element, a surface that faces the semiconductor substrate 20 in the Z direction is defined as a lower surface, and an opposite surface is defined as an upper surface. FIG. 3 is a cross-sectional view of the memory cell array 10 along the Y direction. FIG. 4 is a plan view showing conductors 25 (middle electrodes ME) on the XY plane.

As illustrated in FIG. 3, the magnetic memory device 1 includes a semiconductor substrate 20, insulating layers 21, 23, and 29, interconnect layers 22 and 30, elements 24 and 26, conductors 25, hard masks 27, and insulators 28. A combination of the element 24, the conductor 25, the element 26, and the hard mask 27, which are stacked in the Z direction, functions as one memory cell MC.

The insulating layer 21 is provided on the upper surface of the semiconductor substrate 20. The interconnect layers 22 are provided in an upper portion including the upper surface of the insulating layer 21. The interconnect layers 22 each extend in the X direction and are arranged side by side in the Y direction. The interconnect layers 22 function as the word lines WL. The interconnect layers 22 are formed of a conductive material. The interconnect layers 22 may be provided above the semiconductor substrate 20 with an insulating layer interposed therebetween. Furthermore, a circuit not shown (a transistor element, an interconnect layer, or the like) may be provided between the semiconductor substrate 20 and the interconnect layer 22.

The insulating layer 23 is provided on the upper surface of the insulating layer 21. In this embodiment, the insulating layer 23 is separated between the memory cells MC. The insulating layer 23 is provided in an identical layer to the element 24. The insulating layer 23 has, for example, a truncated cone shape surrounding the element 24. Thus, the side surface of the insulating layer 23 may have a tapered shape. For the insulating layer 23, an insulating material containing, for example, a silicon oxide film (SiO), is used.

A plurality of elements 24 are provided on the upper surface of the interconnect layers 22. One element 24 functions as the selector SEL of one memory cell MC. For example, the elements 24 are arranged in a matrix pattern in the X direction and the Y direction on the XY plane. The elements 24 that are arranged in the X direction are located on the upper surface of one interconnect layer 22. An electrode may be provided between and electrically couple the interconnect layer 22 and the element 24. The element 24 is formed of a material including an insulator, and contains a dopant introduced by ion implantation. The insulator contains, for example, an oxide. More specifically, the insulator contains, for example, SiO or a material substantially formed of SiO. The dopant contains, for example, arsenic (As) or germanium (Ge). These materials have a characteristic of being easily agglomerated in SiO. Hereinafter, a case where the dopant is As will be explained.

The element 24 is formed by implanting the dopant into the insulating layer 23. The upper surface of the element 24 is physically damaged by the dopant during the ion implantation of the dopant. Therefore, the upper surface of the element 24 is lower than the upper surface of the insulating layer 23 in the Z direction. For example, a length (thickness) $h1$ of the insulating layer 23 in the Z direction and a length (thickness) $h2$ of the element 24 in the Z direction have the relationship $h1>h2$.

The element 24 has a substantially columnar shape, for example. The substantially columnar shape includes a shape having an upper or bottom surface of a perfect circle or an almost perfect circle. The shape of the element 24 is not limited to a columnar shape. The shape of the element 24 depends on, for example, a profile of the dopant. Therefore, the element 24 may be, for example, a truncated cone. Furthermore, the upper surface of the element 24 may be a rectangle. To simplify the description, a case will be described below where the element 24 has a columnar shape. Although FIG. 3 shows a case where the interconnect layer 22 and the element 24 are equal in length in the Y direction, the embodiment is not limited to this case. The length of the interconnect layer 22 in the Y direction (that is, the interconnect width of the word line WL) may differ from the length of the element 24 in the Y direction (that is, the diameter of the circular selector SEL).

The element 24 is formed by implanting the dopant into the insulating layer 23. Thus, the element 24 is formed without a process of dry etching or the like. Therefore, an interface between the insulating layer 23 and the element 24 cannot be observed with a transmission electron microscope (TEM). However, the element 24 can be recognized by measuring a distribution of the dopant by electron energy-loss spectroscopy (EELS) analysis or energy dispersive X-ray spectroscopy (EDX) analysis with the TEM.

The conductor 25 is provided on the upper surfaces of the insulating layer 23 and the element 24. The conductor 25 functions as a middle electrode (ME) between the selector SEL (the element 24) and the magnetoresistive effect element MTJ (the element 26). The conductor 25 may have, for example, a substantially truncated cone shape. Thus, the side surface of the conductor 25 may have a tapered shape. The conductor 25 is formed of a conductive material and contains, for example, titanium nitride (TiN).

The element 26 is provided on the upper surface of the conductor 25. The element 26 functions as a magnetoresistive effect element MTJ. The element 26 may have a substantially truncated cone shape. Thus, the side surface of the element 26 may have a tapered shape. The details of the configuration of the element 26 will be described later.

The hard mask 27 is provided on the upper surface of the element 26. The hard mask 27 functions as a hard mask to be used when the element 26, the conductor 25, and the insulator 23 are processed. The hard mask 27 may have a substantially truncated cone shape. Thus, the side surface of the hard mask 27 may have a tapered shape. The hard mask 27 is formed generally of a conductive material, and contains, for example, TiN or tungsten (W), but may be formed of an insulating material.

A layer stack formed of the insulating layer 23, the element 24, the conductor 25, the element 26, and the hard mask 27 may have a substantially truncated cone shape. The layer stack is processed in batch processing, using the hard mask 27 as a mask. Therefore, the outer peripheral shape of the lower surface of the hard mask 27 is almost identical to the outer peripheral shape of the upper surface of the element 26. The outer peripheral shape of the lower surface of the element 26 is almost identical to the outer peripheral shape of the upper surface of the conductor 25. The outer peripheral shape of the lower surface of the conductor 25 is almost identical to the outer peripheral shape of the upper surface of the insulating layer 23. The expression "almost the same" may include an error that occurs in the manufacturing process, for example, a difference in etching rate due to a difference in materials, etc. For example, the taper angle of the side surface of the layer stack (that is, the inclination angle of the side surface) may be reduced from the upper surface side toward the lower surface side. For example, a taper angle θ1 of the element 26, a taper angle θ2 of the conductor 25, and a taper angle θ3 of the insulating layer 23 have the relationship θ1>θ2>θ3. The shape of the layer stack is not limited to a truncated cone shape. The side surface of the layer stack depends on an etching characteristic when the layer stack is processed. For example, the layer stack may have a columnar shape. Furthermore, the upper surface of the layer stack (the hard mask 27) may be rectangular. To simplify the description, a case will be described below where the layer stack has a truncated cone shape.

The insulator 28 is provided on side surfaces of the conductor 25, the element 26, and the hard mask 27. The insulator 28 functions as a protecting film, namely, a side wall SW, to protect the element 26 when the insulating layer 29 is deposited. The upper end of the insulator 28 is at any height. The upper end of the insulator 28 may be higher or lower than the upper end of the element 26. Furthermore, the insulator 28 may be omitted. For example, the insulator 28 is redeposited material generated when the insulating layer 23 is processed. Therefore, the constituent element of the insulator 28 may the same as that of the insulating layer 23. The insulator 28 contains, for example, SiO.

The insulating layer 29 is provided in the identical layer to the layer stack. For the insulating layer 29, for example, silicon nitride (SiN) is used.

A plurality of interconnect layers 30 are each provided on the hard mask 27 and the insulating layer 29. The interconnect layers 30 function as bit lines BL. The interconnect layers 30 each extend in the Y direction and are arranged side by side in the X direction. The upper surface of the hard mask 27 is coupled to the lower surface of any of the interconnect layers 30. More specifically, a plurality of hard masks 27 (in other words, the elements 26) arranged in the Y direction are coupled to one interconnect layer 30. The interconnect layer 30 is formed of a conductive material and contains, for example, tungsten (W). An electrode may be provided between and electrically couple the hard mask 27 and the interconnect layer 30.

As illustrated in FIG. 3 and FIG. 4, in the present embodiment, if the upper surface of the element 24 has a substantially circular shape, the longest diameter thereof (hereinafter referred to as "the longest diameter") is defined as d1. If the lower surface of the conductor 25, namely, the surface that faces the element 24 and the insulating layer 23, has a substantially circular shape, the longest diameter thereof is defined as d2. In this case, the longest diameter d1 and the longest diameter d2 have the relationship d1<d2. In other words, according to the present embodiment, the area of the upper surface of the element 24 (the surface facing the conductor 25) is smaller than the area of the lower surface of the conductor 25 (the surface facing the element 24 and the insulating layer 23). The distance between the upper surfaces of the adjacent elements 24 is defined as d3, and the distance between the lower surfaces of the adjacent conductors 25 is defined as d4. In this case, the distance d3 and distance d4 have the relationship d3>d4. The shape of the upper surface of the element 24 and the shape of the lower surface of the adjacent conductor 25 need not be the same. For example, either one of the upper surface of the element 24 or the lower surface of the conductor 25 may be circular, while the other may be rectangular.

In the embodiment described above, the magnetoresistive effect elements MTJ and the bit lines BL are arranged above the word lines WL. However, the arrangement is not limited to this. For example, the magnetoresistive effect elements MTJ and the word lines WL may be arranged above the bit lines BL. In this case, the interconnect layers 22 function as the bit lines BL, and the interconnect layers 30 function as the word lines WL.

1.1.4 Configuration of Magnetoresistive Effect Element

Figure 5:
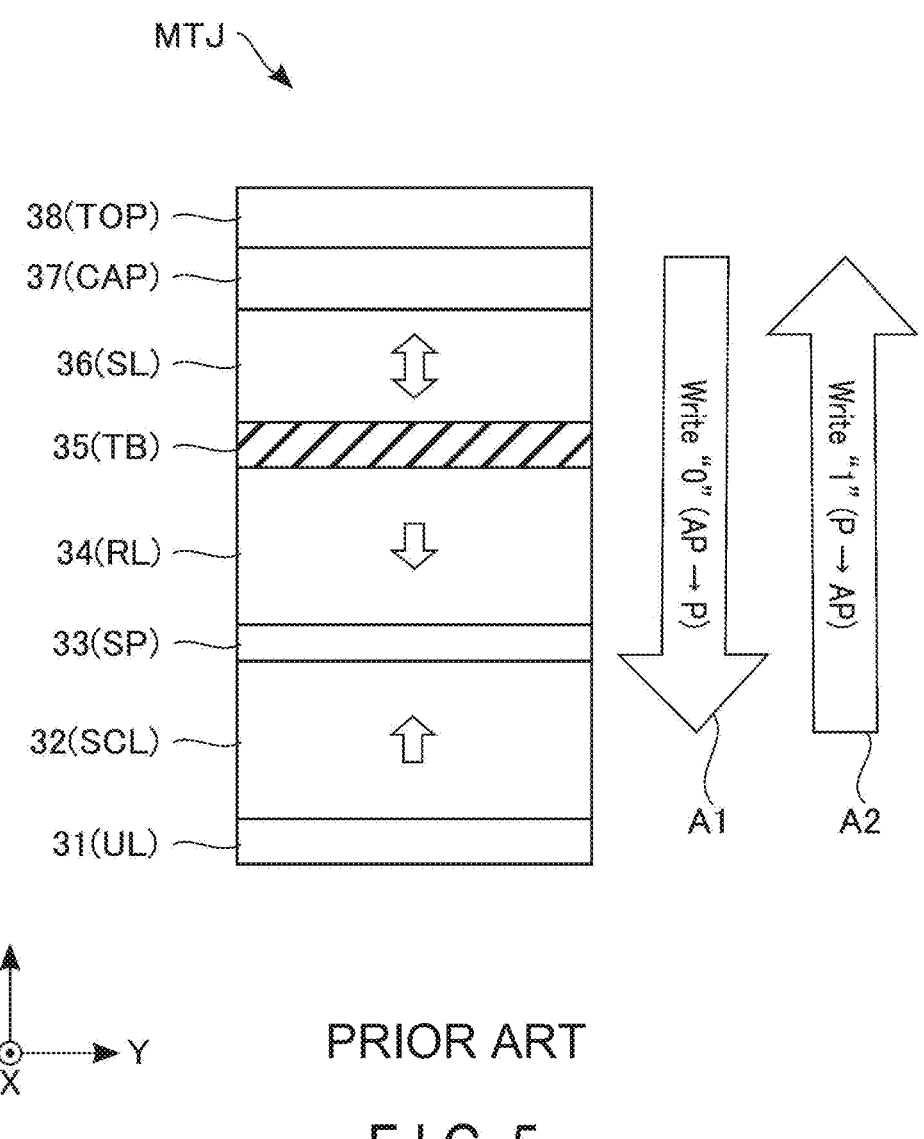
FIG. 5 is a cross-sectional view of a magnetoresistive effect element included in the magnetic memory device according to the first embodiment.

Next, an example of a configuration of a magnetoresistive effect element MTJ will be described with reference to FIG. 5. FIG. 5 is a cross-sectional view showing a configuration of the element 26, namely, the magnetoresistive effect element MTJ.

As illustrated in FIG. 5, the magnetoresistive effect element MTJ (the element 26) includes a nonmagnet 31, a ferromagnet 32, a nonmagnet 33, a ferromagnet 34, a nonmagnet 35, a ferromagnet 36, a nonmagnet 37, and a nonmagnet 38. The nonmagnet 31 functions as an under layer UL. The ferromagnet 32 functions as a shift cancelling layer SCL. The nonmagnet 33 functions as a spacer layer SP. The ferromagnetic 34 functions as a reference layer RL. The nonmagnet 35 functions as a tunnel barrier layer TB. The ferromagnet 36 functions as a storage layer SL. The nonmagnet 37 functions as a capping layer CAP. The nonmagnet 38 functions as a top layer TOP.

In the magnetoresistive effect element MTJ, for example, the nonmagnet 31, the ferromagnet 32, the nonmagnet 33, the ferromagnet 34, the nonmagnet 35, the ferromagnet 36, the nonmagnet 37, and the nonmagnet 38 are stacked in this order, from the side of the word line WL (the interconnect layer 22) toward the side of the bit line BL (the interconnect layer 30). Alternatively, the nonmagnet 38, the nonmagnet 37, the ferromagnet 36, the nonmagnet 35, the ferromagnet 34, the nonmagnet 33, the ferromagnet 32, and the nonmagnet 31 may be stacked in this order, from the side of the word line WL (the interconnect layer 22) toward the side of the bit line BL (the interconnect layer 30).

The magnetoresistive effect element MTJ functions as, for example, a perpendicular-magnetization type magnetoresistive effect element in which the magnetization direction of a magnet constituting the magnetoresistive effect element MTJ is perpendicular to the film surface (in the Z direction in the example of FIG. 5). The magnetoresistance effect element MTJ may further include unillustrated layers between the layers 31 to 38.

The nonmagnet 31 is a nonmagnetic conductor, and functions as an electrode for improving electrical connectivity with the selector SEL (the element 24). The nonmagnet 31 contains, for example, a high-melting-point metal. The high-melting-point metal is a material having a melting point higher than that of, for example, iron (Fe) and cobalt (Co), and includes, for example, at least one element selected from zirconium (Zr), hafnium (Hf), tungsten (W), chromium (Cr), molybdenum (Mo), niobium (Nb), titanium (Ti), tantalum (Ta), vanadium (V), ruthenium (Ru), and platinum (Pt).

The ferromagnet 32 has ferromagnetic properties, and has an axis of easy magnetization in a direction perpendicular to the film surface. The magnetization direction of the ferromagnet 32 is fixed; in the example of FIG. 5, the magnetization direction is oriented to the ferromagnet 34. In this description, the "magnetization direction" being "fixed" means that the magnetization direction is not changed even by a current (spin torque) large enough to reverse the magnetization direction of the ferromagnet 36 (the storage layer SL). The ferromagnet 32 includes at least one alloy selected from, for example, cobalt platinum (CoPt), cobalt nickel (CoNi), and cobalt palladium (CoPd). The ferromagnet 32 may be a layer stack including a plurality of layers. In this case, the ferromagnet 32 may include, for example, at least one multilayer film selected from a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The nonmagnet 33 is provided between the ferromagnet 32 (the shift cancelling layer SCL) and the ferromagnet 34 (the reference layer RL). The nonmagnet 33 is a non-magnetic conductor, and contains at least one element selected from, for example, ruthenium (Ru), osmium (Os), iridium (Ir), vanadium (V), and chromium (Cr).

The ferromagnet 34 has ferromagnetic properties, and has an axis of easy magnetization in a direction perpendicular to a film surface. The magnetization direction of the ferromagnet 34 is fixed, and in the example of FIG. 5, oriented to the ferromagnet 32. The ferromagnet 34 contains, for example, at least one of iron (Fe), cobalt (Co), and nickel (Ni). The ferromagnet 34 may further contain boron (B). More specifically, the ferromagnet 34 may contain, for example, iron cobalt boron (FeCoB) or iron boron (FeB), and have a body-centered crystal structure.

The ferromagnet 34 may be a layer stack including multiple films, although not illustrated in FIG. 5. Specifically, the layer stack constituting the ferromagnet 34 may be, for example, a structure including a layer containing iron cobalt boron (FeCoB) or iron boron (FeB) as an interface layer with the nonmagnet 35, and including an additional ferromagnet stacked between the interface layer and the nonmagnet 33 via a nonmagnetic conductor. The nonmagnetic conductor in the layer stack constituting the ferromagnet 34 may contain, for example, at least one metal selected from tantalum (Ta), hafnium (Hf), tungsten (W), zirconium (Zr), molybdenum (Mo), niobium (Nb), and titanium (Ti). The additional ferromagnet in the layer stack constituting the ferromagnet 34 may include at least one multilayer film selected from, for example, a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The ferromagnets 32 and 34 are coupled in an anti-ferromagnetic manner by the nonmagnet 33. In other words, the ferromagnets 32 and 34 are coupled in a manner in which they have mutually-anti-parallel magnetization directions. Accordingly, the magnetization directions of the ferromagnets 32 and 34 are opposite to each other in the example of FIG. 5. Such a bonding structure of the ferromagnet 32, the nonmagnet 33, and the ferromagnet 34 as described above is called a synthetic anti-ferromagnetic (SAF) structure. This allows the ferromagnet 32 to compensate for the influence of a stray field of the ferromagnet 34 on the magnetization direction of the ferromagnet 36. This prevents an asymmetry from occurring in the ease of reversal of the magnetization direction of the ferromagnet 36, due to, e.g., a stray field of the ferromagnet 34 (that is, prevents the ease of reversal of the magnetization direction of the ferromagnet 36 from differing between the case of reversing from one side to the other and the case of reversing in the opposite direction).

The nonmagnet 35 is a non-magnetic insulator, and contains, for example, magnesium oxide (MgO). The nonmagnet 35 has an NaCl crystal structure with its film surface oriented in a (001) plane, and functions as a seed material to be a nucleus for growth of a crystalline film from an interface with the ferromagnet 36 during a crystallization process of the ferromagnet 36. The nonmagnet 35 is arranged between the ferromagnet 34 and the ferromagnet 36, and constitutes a magnetic tunnel junction together with the two ferromagnets.

The ferromagnet 36 has ferromagnetic properties, and has an axis of easy magnetization in a direction perpendicular to a film surface. In other words, the ferromagnet 36 has a magnetization direction toward either the bit lines BL or the word lines WL in the Z direction. The ferromagnet 36 contains at least one of iron (Fe), cobalt (Co), and nickel (Ni). The ferromagnet 36 further contains boron (B). More specifically, the ferromagnet 36 may contain, for example, iron cobalt boron (FeCoB) or iron boron (FeB), and have a body-centered crystal structure.

The nonmagnet 37 has a function of preventing the damping coefficient of the ferromagnet 36 from increasing, and of reducing a write current. The nonmagnet 37 contains at least one nitride or oxide selected from, for example, magnesium oxide (MgO), magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), and vanadium nitride (VN). The nonmagnet 37 may be a mixture of any of these nitrides and oxides. Specifically, the nonmagnet 37 is not limited to a binary compound consisting of two different elements, and may be a ternary compound consisting of three different elements, such as titanium aluminum nitride (AlTiN).

The nonmagnet 38 is a nonmagnetic conductor, and functions as a top electrode that enhances electrical connectivity between the upper end of the magnetoresistive effect element MTJ and the bit line BL. The nonmagnet 38 contains, for example, at least one element or compound selected from tungsten (W), tantalum (Ta), tantalum nitride (TaN), titanium (Ti), and titanium nitride (TiN).

In the present embodiment, a write current is allowed to flow through the magnetoresistive effect element MTJ, and a spin torque is injected into the storage layer SL. A spin injection write technique, in which the magnetization direction of the storage layer SL is controlled by the injected spin torque, is adopted. The magnetoresistive effect element MTJ can take one of a low-resistance state and a high-resistance state, depending on whether the magnetization directions of the storage layer SL and the reference layer RL are parallel or anti-parallel.

When a write current Ic0 of a magnitude is allowed to flow through the magnetoresistive effect element MTJ in the direction of an arrow A1 in FIG. 5, namely, the direction from the storage layer SL toward the reference layer RL, the relative relationship between the magnetization direction of the storage layer SL and the magnetization direction of the reference layer RL becomes parallel. In this parallel state, the resistance of the magnetoresistive effect element MTJ takes the minimum value, and the magnetoresistive effect element MTJ is set to a low-resistance state. This low-resistance state is called a "parallel (P) state", and is defined as, for example, the state of data "0".

When a write current Ic1 of a magnitude greater than that of the write current Ic0 is allowed to flow through the magnetoresistive effect element MTJ in the direction of an arrow A2 in FIG. 5, namely, the direction from the reference layer RL toward the storage layer SL (opposite to the arrow A1), the relative relationship between the magnetization directions of the storage layer SL and the magnetization direction of the reference layer RL becomes anti-parallel. In this anti-parallel state, the resistance of the magnetoresistive effect element MTJ takes the maximum value, and the magnetoresistive effect element MTJ is set to a high-resistance state. This high-resistance state is called an "anti-parallel (AP) state", and is defined as, for example, the state of data "1".

The following description will be given pursuant to the above-described data-defining method; however, how data "1" and data "0" are defined is not limited to the above-described example. For example, the P state may be defined as data "1", and the AP state may be defined as data "0".

1.2 Method for Manufacturing Memory Cell Array

Next, an example of a method for manufacturing the memory cell array 10 will be described with reference to FIG. 6 to FIG. 12. FIG. 6 is a flowchart showing a method for manufacturing the memory cell array 10. FIG. 7 to FIG. 12 are cross-sectional views of the memory cell array 10 to explain the method for manufacturing the memory cell array 10. In the explanation below, details of the stacked structure constituting the element 26 (the magnetoresistive effect element MTJ) are omitted.

As illustrated in FIG. 6, S1 through S8 are sequentially executed as steps of manufacturing the memory cell array 10. Details of each step will be described.

<S1>

First, as illustrated in FIG. 7, the word lines WL are formed. More specifically, the interconnect layers 22 functioning as the word lines WL are formed in the insulating layer 21 formed on the upper surface of the semiconductor substrate 20. The interconnect layers 22 may be trench interconnects obtained by forming trench patterns on a top portion of the insulating layer 21 and thereafter filling the insides of the trench patterns with a conductive material. Alternatively, the interconnect layers 22 may be obtained by depositing a conductive material on the insulating layer 21 and thereafter processing the conductive material. In this case, after the interconnect layers 22 are formed, the insulating layer 21 is formed to fill a space between the interconnect layers 22.

<S2>

Next, as illustrated in FIG. 8, the insulating layer 23 is deposited. More specifically, on the upper surfaces of the insulating layer 21 and the interconnect layers 22, the insulating layers 23 are deposited by, for example, chemical vapor deposition (CVD).

<S3>

Next, as illustrated in FIG. 9, resist mask 40 for ion implantation (I/I) is formed. More specifically, resist mask 40 for ion implantation is formed on the upper surfaces of the insulating layers 23 using photolithography. The resist mask 40 is opened at areas corresponding to the elements 24 (the selectors SEL) (hereinafter referred to as the "opening areas").

<S4>

Next, as illustrated in FIG. 9, As is implanted to form the elements 24 (the selectors SEL). More specifically, As is implanted into the insulating layers 23 exposed through the opening areas of the resist mask 40. At this time, due to the implantation of As, the thickness of the insulating layers 23 (the elements 24) is reduced. After the ion implantation, the resist mask 40 is removed by, for example, O$_2$ asking. Next, a heat treatment for activating As is performed. As a result, the elements 24 are formed in the areas of the insulating layers 23 that have been doped with As.

<S5>

Next, as illustrated in FIG. 10, the conductor 25 (the middle electrodes ME) and a stacked film 50 corresponding to the elements 26 (the magnetoresistive effect elements MTJ) are deposited. More specifically, on the upper surfaces of the insulating layers 23 and the elements 24, the conductor 25 and the stacked film 50 corresponding to the elements 26 (namely, the nonmagnet 31, the ferromagnet 32, the nonmagnet 33, the ferromagnet 34, the nonmagnet 35, the ferromagnet 36, the nonmagnet 37, and the nonmagnet 38) are sequentially deposited by CVD, sputtering, or the like.

<S6>

Next, as illustrated in FIG. 11, the hard masks 27 are formed. More specifically, first, a conductive material corresponding to the hard masks 27 is deposited on the upper surface of the stacked film 50 corresponding to the elements 26. Next, resist mask for processing the conductive material is formed using photolithography. Then, the conductive material is processed. After the processing of the conductive material, the resist mask is removed. Thus, the hard masks 27 are formed.

<S7>

Next, as illustrated in FIG. 12, the stacked film 50 corresponding to the elements 26, the conductors 25, and the insulating layers 23 are sequentially processed. More specifically, the stacked film 50 corresponding to the elements 26, the conductors 25, and the insulating layers 23 are sequentially processed by, for example, ion beam etching (IBE) using the hard masks 27 as a mask. Redeposited material generated when the insulating layers 23 were processed is deposited on the side surfaces of the elements 26 (the processed stacked film 50), thereby forming the insulators 28. As a result, the magnetoresistive effect elements MTJ (the elements 26) and the middle electrodes ME are formed.

<S8>

Next, as illustrated in FIG. 3, the insulating layer 29 is formed to bury the memory cells MC. More specifically, after the insulating layer 29 is deposited, the insulating layer 29 is polished by, for example, chemical mechanical polishing (CMP) until the upper surfaces of the hard masks 27 are exposed. As a result, the insulating layer 29 is flattened.

<S9>

Next, as illustrated in FIG. 3, interconnect layers 30 (the bit lines BL) are formed on the upper surfaces of the hard masks 27.

1.3 Advantageous Effects of Present Embodiment

The configuration of the present embodiment can lower the difficulty level of processing magnetoresistive effect elements MTJ. Such an advantage will be explained in detail below.

For example, there are some cases where a layer stack of materials for use in forming selectors SEL, middle electrodes ME, and magnetoresistive effect elements MTJ are processed using a hard mask as a mask. In such a case, to process the magnetoresistive effect elements MTJ and the middle electrodes ME, for example, IBE is used to reduce chemical damage due to reactive ion etching (RIE). To process the selectors SEL, the RIE is used to reduce physical damage due to the IBE. Deterioration of leakage current characteristics of the selectors SEL is reduced by reducing the physical damage. Therefore, the hard mask is formed to be relatively thick so as not to be lost midway in the IBE and the RIE. As the thickness of the hard mask is increased, the overall aspect ratio is increased. Therefore, the processing accuracy of the IBE and the RIE is required to be high. Thus, the difficulty level of processing the magnetoresistive effect elements MTJ is increased. Therefore, it may be necessary to process the selectors SEL before forming the middle electrodes ME and the stacked film corresponding to the magnetoresistive effect elements MTJ. In this case, since the number of steps is increased, the manufacturing cost is increased.

For example, if the side surfaces of the magnetoresistive effect elements MTJ, the middle electrodes ME, and the selectors SEL are processed to a tapered shape, the distance between the adjacent selectors SEL is shorter than the distance between the adjacent middle electrodes ME. In this case, a leakage current or interference due to capacity coupling may be liable to occur between the adjacent selectors SEL. Accordingly, it is highly likely that a malfunction may occur in a write operation and a read operation. Furthermore, to suppress the interference between the adjacent selectors SEL, the cell density of the memory cells MC on the XY plane may not be increased.

In contrast, according to the configuration of the present embodiment, the elements 24 (the selectors SEL) can be formed by implanting a dopant into the insulating layers 23. Accordingly, the selectors SEL can be formed without using the hard masks 27. Since it is unnecessary to process the selectors SEL, the processing damage of the selectors SEL can be suppressed.

Furthermore, according to the configuration of the present embodiment, since processing of the elements 24 (the selectors SEL) is not performed, the elements 26 (the magnetoresistive effect elements MTJ), the conductors 25 (the middle electrodes ME), and the insulating layers 23 can be processed in batch processing by the IBE. Thus, the increase in thickness of the hard masks 27 can be suppressed. Therefore, it is possible to suppress the increase in difficulty level of processing the magnetoresistive effect elements MTJ due to the increase in thickness of the hard masks 27.

Furthermore, since the elements 26, the conductors 25, and the insulating layers 23 can be processed in batch processing by the IBE, the number of steps of manufacturing the memory cells MC can be reduced and the manufacturing cost can be reduced.

Moreover, according to the configuration of the present embodiment, the insulating layers 23 between the memory cells MC, namely, between the selectors SEL, can be separated. As a result, the diffusion of the dopant via the insulating layers 23 and the increase in leakage current between the adjacent selectors SEL can be suppressed.

Furthermore, in the configuration according to the present embodiment, the diameter of the upper surface of the element 24 (the selector SEL) can be smaller than the diameter of the lower surface of the conductor 25 (the middle electrode ME). In other words, the area of the upper surface of the selector SEL can be smaller than the area of the lower surface of the middle electrode ME. Therefore, the distance between the adjacent selectors SEL can be longer than the distance between the adjacent middle electrodes ME. Accordingly, the interference between the adjacent selectors SEL can be suppressed. Thus, the interference between the adjacent magnetoresistive effect elements MTJ can be suppressed. It is thus possible to suppress the occurrence of malfunctions and improve the reliability of the magnetic memory device.

Moreover, in the configuration according to the present embodiment, the increase in difficulty level of processing the magnetoresistive effect elements MTJ can be suppressed, and the interference between the adjacent magnetoresistive effect elements MTJ can be suppressed. Therefore, the cell density of the memory cells MC can be increased, to achieve a high integration of the magnetic memory device.

In addition, in the configuration according to the present embodiment, the insulators 28 can be formed on the side surfaces of the elements 26, when the insulating layers 23 are processed by the IBE. Deterioration of the characteristics of the elements 26 that may occur when the insulating layer 29 is formed can be suppressed. More specifically, in a case where the insulating layer 29 is formed of SiN, the insulators 28 can prevent an MgO layer in the elements 26 (the magnetoresistive effect element MTJ) from being directly brought into contact with SiN.

1.4 Modification

Next, a modification of the first embodiment will be described with reference to FIG. 13. In the description of the modification of the first embodiment, differences in structure of a memory cell array 10 from that of the first embodiment will be described. FIG. 13 is a cross-sectional view of the memory cell array 10 along the Y direction. Hereinafter, differences from the first embodiment will be mainly described.

As illustrated in FIG. 13, in this modification, an insulating layer 23 between memory cells MC is not completely removed (separated). The other structures are similar to those of the first embodiment shown in FIG. 3.

More specifically, a height (thickness) of a portion of the insulating layer 23 in the Z direction under the conductor 25 is defined as h1. A height (thickness) of the element 24 in the Z direction is defined as h2, and a height (thickness) of a thinnest portion of the insulating layer 23 in the Z direction between the memory cells MC is defined as h3. In this case, the height h1, the height h2, and the height h3 have the relationship h1>h2>h3>0.

The configuration of this modification can attain advantages similar to those of the first embodiment.

2. Second Embodiment

A second embodiment will now be described. In the description of the second embodiment, a structure of a memory cell MC different from that of the first embodiment will be described. Hereinafter, differences from the first embodiment will be mainly described.

2.1 Structure of Memory Cell Array

Next, an example of a structure of a memory cell array 10 will be described with reference to FIG. 14. FIG. 14 is a cross-sectional view of the memory cell array 10 along the Y direction.

As illustrated in FIG. 14, in the present embodiment, elements 26, conductors 25, elements 24 (and insulating layers 23), and hard masks 27 are sequentially stacked on interconnect layers 22 in this order. Insulators 28 are omitted. An electrode may be provided between and electrically couple the interconnect layer 22 and the element 26.

A layer stack formed of the element 26, the conductor 25, the insulating layer 23 (and the element 24), and the hard mask 27 may have a substantially truncated cone shape. The layer stack is processed in batch processing, using the hard mask 27 as a mask. Therefore, the outer peripheral shape of the lower surface of the hard mask 27 is almost identical to the outer peripheral shape of the upper surface of the insulating layer 23. The outer peripheral shape of the lower surface of the insulating layer 23 is almost identical to the outer peripheral shape of the upper surface of the conductor 25. The outer peripheral shape of the lower surface of the conductor 25 is almost identical to the outer peripheral shape of the upper surface of the element 26. For example, the taper angle of the side surface of the layer stack is reduced from the upper surface side toward the lower surface side.

In the present embodiment, for example, if the lower surface of the hard mask 27, namely, the surface that faces the element 24 and the insulating layer 23, has a substantially circular shape, the longest diameter thereof is defined as d5. If the upper surface of the conductor 25, namely, the surface that faces the element 24 and the insulating layer 23, has a substantially circular shape, the longest diameter thereof is defined as d6. If the lower surface of the conductor 25, namely, the surface that faces the element layer 26, has a substantially circular shape, the longest diameter thereof is defined as d7. In this case, the longest diameter d1 of the element 24, and the longest diameters d5, d6, and d7 have the relationship d1<d5<d6<d7. That is, the area of the upper surface of the element 24 is smaller than the area of the lower surface of the hard mask 27. The sum of the areas of the lower surfaces of the insulating layer 23 and the element 24 is smaller than the area of the upper surface of the element 26.

2.2 Method for Manufacturing Memory Cell Array

Next, an example of a method for manufacturing the memory cell array 10 will be described with reference to FIG. 15 to FIG. 22. FIG. 15 is a flowchart showing a method for manufacturing the memory cell array 10. FIG. 16 to FIG. 22 are cross-sectional views of the memory cell array 10 to explain the method for manufacturing the memory cell array 10. In the explanation below, details of the stacked structure constituting the element 26 (the magnetoresistive effect element MTJ) are omitted.

As illustrated in FIG. 15, S11 through S19 are sequentially executed as steps of manufacturing the memory cell array 10. Details of each step will be described.
<S11>
Word lines WL are formed in the same manner as in S1 of the first embodiment.
<S12>
Next, as illustrated in FIG. 16, a stacked film 50 corresponding to the element 26 (the magnetoresistive effect element MTJ), the conductor 25, and the insulating layer 23 are sequentially deposited. More specifically, on the upper surfaces of the insulating layer 21 and the interconnect layers 22, the stacked film 50 corresponding to the elements 26 (namely, a nonmagnet 31, a ferromagnet 32, a nonmagnet 33, a ferromagnet 34, a nonmagnet 35, a ferromagnet 36, a nonmagnet 37, and a nonmagnet 38), the conductor 25, and the insulating layer 23 are sequentially deposited by CVD, sputtering, or the like.
<S13>
Next, as illustrated in FIG. 17, resist mask 60 for hard masks is formed. More specifically, resist mask 60 for hard masks is formed on the upper surface of the insulating layer 23 using photolithography. The resist mask 60 is opened at areas corresponding to hard masks 27.
<S14>
Next, as illustrated in FIG. 18, a barrier metal 27*a* is deposited. More specifically, the barrier metal 27*a* is deposited on the upper surface of the resist mask 60 so as to cover the opening areas of the resist mask 60. The barrier metal 27*a* functions as a barrier metal when forming the hard masks 27. The barrier metal 27*a* is thin so as not to entirely bury the opening areas of the resist mask 60. The barrier metal 27*a* is formed of a conductive material, such as TiN.
<S15>
Next, as illustrated in FIG. 19, As is implanted to form the elements 24 (the selectors SEL). More specifically, As is implanted into the insulating layer 23 through the barrier metal 27*a* in the opening areas of the resist mask 60. Assuming that the longest diameter of the opening area of the resist mask 60 is d8, the longest diameter d1 of the element 24 is smaller than the longest diameter d8 of the opening area due to the thickness of the barrier metal 27*a* deposited on the side surfaces of the opening area. Namely, the longest diameters d1 and d8 have the relationship d1<d8. In the example of FIG. 19, As is implanted into the insulating layers 23 through the barrier metal 27*a*. Therefore, the decrease in thickness of the elements 24 explained above in the first embodiment hardly occurs.
<S16>
Next, the hard masks 27 are formed. More specifically, as illustrated in FIG. 20, first, a conductor 27*b* is deposited so as to bury the opening areas of the resist mask 60. The conductor 27*b* is formed of a conductive material. Next, the barrier metal 27*a* and the conductor 27*b* on the resist mask 60 are removed. Next, as illustrated in FIG. 21, the resist mask 60 is removed. As a result, the hard masks 27 including the barrier metal 27*a* and the conductor 27*b* are formed.
<S17>
Next, as illustrated in FIG. 22, the insulating layers 23, the conductive layers 25, and the stacked film 50 corresponding to the elements 26 are processed. More specifically, the insulating layers 23, the conductors 25, and the stacked film 50 corresponding to the element 26 are sequentially processed by, for example, the IBE, using the hard masks 27 as a mask. As a result, the magnetoresistive effect elements MTJ and the middle electrodes ME are formed.
<S18>
Next, in the same manner as in S8 of the first embodiment, the insulating layer 29 is formed to bury the memory cells MC.
<S19>
Next, in the same manner as in S9 of the first embodiment, the interconnect layers 30 (the bit lines BL) are formed on the upper surfaces of the hard masks 27.

2.3 Advantageous Effect of Present Embodiment

The configuration of the present embodiment can attain the same effect as the first embodiment.

In addition, according to the configuration of the present embodiment, the conductors 25 (the middle electrode ME) are formed on the upper surfaces of the elements 26 (the magnetoresistive effect elements MTJ). Furthermore, the elements 24 (the selectors SEL) are formed on the upper surfaces of the conductors 25. Therefore, it is possible to suppress chemical damage on the elements 26 when the elements 24 and the conductors 25 are processed by the IBE. Accordingly, deterioration of the magnetoresistive effect elements MTJ due to processing damage can be reduced.

3. Modification

The embodiments described above are merely examples, and can be modified in various manners.

For example, in the embodiments described above, the magnetoresistive effect element MTJ has a top-free structure in which the storage layer SL is provided above the reference layer RL. However, the embodiments are not limited thereto. For example, the magnetoresistance effect element MTJ may have a bottom-free structure in which the storage layer SL is provided below the reference layer RL.

Furthermore, in the memory cell array 10 of the embodiments described above, all memory cells MC are provided in the identical layer. However, the embodiments are not limited thereto. A plurality of memory cells MC may be stacked in the Z direction.

The method for forming the middle electrodes ME and the magnetoresistive effect elements MTJ is not limited to that of the embodiments described above. As long as the method for forming the selectors SEL is the same as that in the embodiments described above, the middle electrodes ME and the magnetoresistive effect elements MTJ may be formed by any method.

Furthermore, the term "couple" in the above-described embodiments also includes the state of indirect coupling with other components, such as a transistor and a resistor, interposed therebetween.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a first interconnect extending in a first direction;
a second interconnect extending in the first direction and arranged beside the first interconnect in a second direction intersecting the first direction;
a first switching element provided on the first interconnect;
a second switching element provided on the second interconnect and arranged adjacent to the first switching element in the second direction;
a third switching element provided on the first interconnect and arranged adjacent to the first switching element in the first direction;
a first insulating layer provided in an identical layer to the first switching element and extending around an entirety of the first switching element along a circumferential direction of the first switching element;
a second insulating layer provided in an identical layer to the second switching element, the second insulating layer not being in contact with the first insulating layer, and the second insulating layer extending around an entirety of the second switching element along a circumferential direction of the second switching element;
a third insulating layer provided in an identical layer to the third switching element, the third insulating layer not being in contact with the first insulating layer and not being in contact with the second insulating layer, and the third insulating layer extending around an entirety of the third switching element along a circumferential direction of the third switching element;
a first magnetoresistive effect element provided above the first switching element;
a second magnetoresistive effect element provided above the second switching element; and
a third magnetoresistive effect element provided above the third switching element.

2. The magnetic memory device according to claim 1, further comprising:
a first conductor provided on the first switching element and the first insulating layer; and
a second conductor provided on the second switching element and the second insulating layer,
wherein an area of a first principal surface of the first switching element that faces the first conductor is smaller than an area of a second principal surface of the first conductor that faces the first switching element.

3. The magnetic memory device according to claim 2, wherein a longest diameter of the first principal surface is shorter than a longest diameter of the second principal surface.

4. The magnetic memory device according to claim 1, wherein:
the first switching element contains silicon and arsenic, and
the first insulating layer contains silicon and contains no arsenic.

5. The magnetic memory device according to claim 1, wherein a length of the first switching element in a third direction intersecting the first direction and the second direction is shorter than a length of the first insulating layer in the third direction.

6. The magnetic memory device according to claim 1, further comprising:
a first conductor provided on the first switching element and the first insulating layer; and
a second conductor provided on the second switching element and the second insulating layer,
wherein an outer peripheral shape of a surface of the first conductor that faces the first insulating layer is identical to an outer peripheral shape of a surface of the first insulating layer that faces the first conductor.

7. The magnetic memory device according to claim 1, wherein an inclination angle of a side surface of the first insulating layer is smaller than an inclination angle of a side surface of the first magnetoresistive effect element.

8. The magnetic memory device according to claim 1, further comprising:
a first hard mask provided on the first magnetoresistive effect element;
a second hard mask provided on the second magnetoresistive effect element; and
a third interconnect provided on the first hard mask and the second hard mask and extending in the second direction.

9. The magnetic memory device according to claim 1, wherein the first magnetoresistive effect element and the second magnetoresistive effect element each include a reference layer, a storage layer, and a tunnel barrier layer interposed between the reference layer and the storage layer.

10. A magnetic memory device comprising:

a first interconnect;

a magnetoresistive effect element provided on the first interconnect;

a switching element provided above the magnetoresistive effect element;

an insulating layer provided in an identical layer to the switching element and surrounding the switching element; and a hard mask provided on the switching element and the insulating layer and contacting with the switching element and the insulating layer, wherein an area of a first principal surface of the switching element that contacts with the hard mask is smaller than an area of a second principal surface of the hard mask that contacts with the switching element.

11. The magnetic memory device according to claim 10, wherein a longest diameter of the first principal surface is shorter than a longest diameter of the second principal surface.

12. The magnetic memory device according to claim 10, wherein:

the switching element contains silicon and arsenic, and the insulating layer contains silicon and contains no arsenic.

13. The magnetic memory device according to claim 10, wherein the magnetoresistive effect element includes a reference layer, a storage layer, and a tunnel barrier layer interposed between the reference layer and the storage layer.

14. The magnetic memory device according to claim 10, further comprising:

a conductor provided between the magnetoresistive effect element and the switching element, wherein an outer peripheral shape of a surface of the conductor that faces the insulating layer is identical to an outer peripheral shape of a surface of the insulating layer that faces the conductor.

15. A method for manufacturing a magnetic memory device, the method comprising:

forming a first interconnect and a second interconnect each extending in a first direction in a first insulating layer, the second interconnect being arranged beside the first interconnect in a second direction intersecting the first direction;

depositing a second insulating layer on the first insulating layer, the second insulating layer, and the first interconnect;

forming, on the second insulating layer, a resist mask corresponding to a first switching element to be provided on the first interconnect, a second switching element to be provided on the second interconnect and to be arranged adjacent to the first switching element in the first direction, and a third switching element to be provided on the second interconnect and to be arranged adjacent to the first switching element in the second direction;

implanting arsenic in a plurality of regions of the second insulating layer where the resist mask is not formed, and forming the first switching element, the second switching element, and the third switching element;

depositing a conductor and a stacked film corresponding to a first magnetoresistive effect element on the first switching element, a second magnetoresistive effect element on the second switching element, a third magnetoresistive effect element on the third switching element, and the second insulating layer;

forming a hard mask; and processing the stacked film, the conductor, and the second insulating layer in sequence using the hard mask as a mask, whereby the second insulating layer is discontinuous at positions between the first switching element and the second switching element, and between the first switching element and the third switching element.

16. The method according to claim 15, wherein the stacked film includes a first ferromagnet, a second ferromagnet, and a nonmagnet interposed between the first ferromagnet and the second ferromagnet.

17. The method according to claim 15, wherein, in the processing, the stacked film, the conductor, and the second insulating layer are processed by ion beam etching (IBE).

18. The method according to claim 15, further comprising forming a third interconnect extending in a second direction intersecting the first direction on the hard mask.

* * * * *